United States Patent
Song

(10) Patent No.: US 10,789,863 B2
(45) Date of Patent: Sep. 29, 2020

(54) DISPLAY DEVICE

(71) Applicant: LG Display Co., Ltd., Seoul (KR)

(72) Inventor: Hyunjoo Song, Seongman-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/596,414

(22) Filed: Oct. 8, 2019

(65) Prior Publication Data

US 2020/0135065 A1    Apr. 30, 2020

(30) Foreign Application Priority Data

Oct. 24, 2018    (KR) ........................ 10-2018-0127358

(51) Int. Cl.
*G09F 9/30*    (2006.01)
*H05K 5/00*    (2006.01)
*H05K 1/02*    (2006.01)

(52) U.S. Cl.
CPC ............. *G09F 9/301* (2013.01); *H05K 1/028* (2013.01); *H05K 5/0017* (2013.01); *H05K 2201/051* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,493,714 B2 * | 7/2013 | Visser | ................... | G06F 1/1613 361/679.01 |
| 8,493,726 B2 * | 7/2013 | Visser | ................... | G06F 1/1601 361/679.3 |
| 8,508,920 B2 * | 8/2013 | Huitema | ................. | G09F 9/301 312/223.3 |
| 8,953,327 B1 * | 2/2015 | Salmon | ................. | G06F 1/1652 160/242 |
| 9,098,241 B1 * | 8/2015 | Cho | ........................ | H05K 1/028 |
| 9,244,494 B2 * | 1/2016 | Hinson | ................. | G06F 15/025 |
| 9,519,313 B2 * | 12/2016 | Kim | ........................ | G06F 1/166 |
| 9,629,237 B2 * | 4/2017 | Cho | ........................ | H05K 1/028 |
| 9,655,267 B2 * | 5/2017 | Cope | ........................ | H05K 7/14 |
| 9,659,512 B2 * | 5/2017 | Lee | ........................ | G09F 9/301 |
| 9,684,340 B2 * | 6/2017 | Han | ........................ | G06F 1/1652 |
| 9,685,100 B2 * | 6/2017 | Choi | ........................ | G06F 1/1652 |
| 9,730,318 B2 * | 8/2017 | Choi | ........................ | H05K 1/028 |
| 9,733,672 B2 * | 8/2017 | Kim | ........................ | G06F 1/1652 |
| 9,743,537 B2 * | 8/2017 | Kim | ........................ | G06F 1/1652 |
| 9,747,822 B2 * | 8/2017 | Lee | ........................ | G09F 9/301 |
| 9,756,757 B2 * | 9/2017 | Park | ........................ | H05K 7/16 |
| 9,772,657 B2 * | 9/2017 | Takayanagi | ........... | G06F 1/1615 |

(Continued)

FOREIGN PATENT DOCUMENTS

KR    10-2018-0045980 A    5/2018

*Primary Examiner* — Lisa Lea-Edmonds
(74) *Attorney, Agent, or Firm* — Fenwick & West LLP

(57) ABSTRACT

A high-resolution rollable display device is disclosed. The display device includes a rollable display panel having a first side and a second side that is longer than the first side. A printed circuit board is disposed along the first side of the rollable display panel. A plurality of flexible films are connected to the printed circuit board. In one embodiment, a first end of each of the plurality of flexible films is connected to the printed circuit board at the first side of the rollable display panel and a second end of each of the plurality of flexible films is connected to the second side of the rollable display panel.

34 Claims, 19 Drawing Sheets

(56) References Cited

U.S. PATENT DOCUMENTS

| | | | | |
|---|---|---|---|---|
| 9,788,440 B2* | 10/2017 | Cho | ........................ | H05K 1/028 |
| 9,836,087 B2* | 12/2017 | Kim | ........................ | G06F 1/1652 |
| 9,877,384 B2* | 1/2018 | Lee | ........................ | H05K 1/028 |
| 9,900,977 B2* | 2/2018 | Lee | ........................ | G06F 1/16 |
| 9,992,881 B2* | 6/2018 | Choi | ........................ | G06F 1/1652 |
| 10,007,475 B2* | 6/2018 | Jeon | ........................ | G06F 3/0482 |
| 10,082,826 B1* | 9/2018 | Salmon | ........................ | G09F 9/301 |
| 10,095,273 B2* | 10/2018 | Choi | ........................ | G06F 1/1652 |
| 10,098,246 B1* | 10/2018 | Cope | ........................ | H05K 7/14 |
| 10,128,458 B2* | 11/2018 | Lee | ........................ | G09G 3/001 |
| 10,135,018 B2* | 11/2018 | Seo | ........................ | H05K 7/20954 |
| 10,143,095 B2* | 11/2018 | Kim | ........................ | G06F 1/1652 |
| 10,143,096 B2* | 11/2018 | Park | ........................ | G06F 1/1652 |
| 10,146,260 B2* | 12/2018 | Lee | ........................ | G06F 1/1652 |
| 10,162,387 B2* | 12/2018 | Takayanagi | ........................ | G06F 1/1615 |
| 10,175,792 B2* | 1/2019 | Kim | ........................ | G06F 3/0412 |
| 10,186,681 B2* | 1/2019 | Kang | ........................ | H01L 51/0097 |
| 10,223,942 B2* | 3/2019 | Chu | ........................ | G09F 9/30 |
| 10,254,797 B2* | 4/2019 | Lee | ........................ | G06F 1/1658 |
| 10,257,945 B2* | 4/2019 | Kim | ........................ | G09F 9/301 |
| 10,263,216 B2* | 4/2019 | Koo | ........................ | G02F 1/133305 |
| 10,264,687 B2* | 4/2019 | Choi | ........................ | H05K 5/0017 |
| 10,299,391 B2* | 5/2019 | Kim | ........................ | G03B 21/58 |
| 10,347,160 B2* | 7/2019 | Takayanagi | ........................ | G09F 11/29 |
| 10,362,689 B2* | 7/2019 | Cho | ........................ | G06F 1/1652 |
| 10,424,229 B2* | 9/2019 | Kim | ........................ | G02F 1/133308 |
| 10,455,710 B2* | 10/2019 | Kim | ........................ | G06F 1/1652 |
| 10,466,748 B2* | 11/2019 | Choi | ........................ | G09G 3/3266 |
| 10,481,640 B2* | 11/2019 | Kim | ........................ | G09F 9/301 |
| 10,488,947 B2* | 11/2019 | Kwon | ........................ | G06F 1/1643 |
| 10,517,180 B2* | 12/2019 | Choi | ........................ | H05K 5/0217 |
| 10,535,836 B2* | 1/2020 | Kim | ........................ | G06F 1/1601 |
| 10,564,676 B2* | 2/2020 | Kwon | ........................ | G06F 1/1652 |
| 10,571,969 B2* | 2/2020 | Yeh | ........................ | G06F 1/1652 |
| 10,582,622 B2* | 3/2020 | Kim | ........................ | G09F 9/301 |
| 2002/0070910 A1* | 6/2002 | Fujieda | ........................ | G06F 1/1615 345/85 |
| 2006/0107566 A1* | 5/2006 | Van Rens | ........................ | G09F 9/35 40/515 |
| 2007/0211036 A1* | 9/2007 | Perkins | ........................ | G06F 1/1615 345/173 |
| 2010/0033435 A1* | 2/2010 | Huitema | ........................ | G06F 1/1615 345/173 |
| 2015/0060777 A1* | 3/2015 | Premutico | ........................ | H01L 51/0097 257/40 |
| 2016/0255713 A1* | 9/2016 | Kim | ........................ | G02F 1/133305 361/749 |
| 2016/0353588 A1* | 12/2016 | Kim | ........................ | G09F 9/301 |
| 2016/0363960 A1* | 12/2016 | Park | ........................ | G06F 1/1656 |
| 2017/0318693 A1* | 11/2017 | Kim | ........................ | H02K 11/21 |
| 2017/0367198 A1* | 12/2017 | Park | ........................ | H01L 51/5237 |
| 2018/0114471 A1* | 4/2018 | Park | ........................ | G09F 9/301 |
| 2018/0182999 A1* | 6/2018 | Oh | ........................ | H01L 51/5246 |
| 2019/0098776 A1* | 3/2019 | Jeon | ........................ | H05K 5/0017 |
| 2019/0141843 A1* | 5/2019 | Park | ........................ | H05K 5/0217 |
| 2019/0198783 A1* | 6/2019 | Kim | ........................ | H01L 33/58 |
| 2019/0204874 A1* | 7/2019 | Kim | ........................ | G06F 1/1643 |
| 2019/0208650 A1* | 7/2019 | Kim | ........................ | H05K 5/0017 |
| 2019/0324501 A1* | 10/2019 | Kim | ........................ | H05K 5/0017 |
| 2020/0004296 A1* | 1/2020 | Lee | ........................ | G06F 1/1641 |
| 2020/0008308 A1* | 1/2020 | Shin | ........................ | H01L 51/5253 |
| 2020/0008309 A1* | 1/2020 | Kim | ........................ | H05K 5/0017 |
| 2020/0013317 A1* | 1/2020 | Cho | ........................ | G09F 9/301 |
| 2020/0043386 A1* | 2/2020 | Kim | ........................ | G09F 9/301 |
| 2020/0077194 A1* | 3/2020 | Kim | ........................ | H04R 9/025 |
| 2020/0084897 A1* | 3/2020 | Shin | ........................ | H05K 5/0217 |
| 2020/0090628 A1* | 3/2020 | Park | ........................ | G09G 5/38 |

* cited by examiner

DISPLAY DEVICE

CROSS-REFERENCE TO RELATED APPLICATIONS

This application claims the priority of Republic of Korea Patent Application No. 10-2018-0127358 filed on Oct. 24, 2018, the disclosure of which is incorporated by reference in its entirety.

BACKGROUND

Field

The present disclosure relates to a display device, and more particularly, to a rollable display device which can display an image even when rolled up.

Description of the Related Art

Display devices used for a computer monitor, a TV, a mobile phone, etc. include an organic light-emitting display (OLED) that emits light by itself, a liquid-crystal display (LCD) that requires a separate light source, etc.

As the display devices have been increasingly applied to diverse fields such as a computer monitor, a TV, and a personal mobile device, the display devices having a large display area and a reduced volume and weight have been studied.

Recently, a rollable display device in which a display part, lines, etc. are formed on a flexible substrate made of flexible plastic and which can display an image even when rolled up has attracted attention as a next-generation display device.

SUMMARY

An object to be achieved by the present disclosure is to provide a display device which can be rolled up in various directions.

Another object to be achieved by the present disclosure is to provide a display device which is not limited in a winding direction and can display high-resolution images by introducing signals to a long side of a display panel.

Yet another object to be achieved by the present disclosure is to provide a display device in which the disposition of a rigid printed circuit board can be flexibly changed according to a winding direction of the display device.

Still another object to be achieved by the present disclosure is to provide a display device which can protect a plurality of flexible films against external impacts, or the like.

Still another object to be achieved by the present disclosure is to provide a display device whose thickness increase is minimized by extending a plurality of flexible films to a minimum.

Still another object to be achieved by the present disclosure is to provide a display device in which a plurality of flexible films is bent to a rear surface of a back cover. Thus, the heat radiation efficiency of the plurality of flexible films can be improved.

Still another object to be achieved by the present disclosure is to provide a display device in which a plurality of flexible films is extended to have slack sufficient to be selectively spaced apart from a rear surface of a back cover. Thus, during winding or unwinding of the display device, stress applied to the plurality of flexible films can be minimized.

Objects of the present disclosure are not limited to the above-mentioned objects, and other objects, which are not mentioned above, can be clearly understood by those skilled in the art from the following descriptions.

Other detailed matters of the exemplary embodiments are included in the detailed description and the drawings.

According to the present disclosure, a plurality of flexible films can be changed in length and bent to easily change a winding direction of a display device.

According to the present disclosure, a high-resolution display device can be implemented by supplying a driving signal to a long side of a display panel regardless of a winding direction of the display device.

According to the present disclosure, the disposition of a rigid printed circuit board can be easily changed according to a winding direction of a display device.

According to the present disclosure, a plurality of flexible films is disposed between a display panel and a back cover to protect the plurality of flexible films.

According to the present disclosure, a plurality of flexible films is extended to a minimum to minimize resistance and heat generation.

According to the present disclosure, a thickness increase of a display device can be minimized by closely contacting the plurality of flexible films with a rear surface of a display panel.

According to the present disclosure, a plurality of flexible films can effectively radiate heat by disposing the plurality of flexible films on a rear surface of a back cover.

According to the present disclosure, a plurality of flexible films connected to a non-active area on a long side of a display panel and a printed circuit board on a short side of the display panel is extended to have slack. Thus, during winding of a display device, stress applied to the plurality of flexible films can be minimized.

In one embodiment, a rollable display device comprises: a rollable display panel including a plurality of pixels, the rollable display panel having a first side that extends along a first direction and a second side that extends along a second direction that is different from the first direction, the second side longer than the first side; a printed circuit board disposed along the first side of the rollable display panel; and a plurality of flexible films each having a first end and a second end, the first end of each of the plurality of flexible films connected to the printed circuit board disposed at the first side of the rollable display panel and the second end of each of the plurality of flexible films connected to the second side of the rollable display panel.

In one embodiment, a rollable display device comprises: a rollable display panel including a plurality of pixels in an active area of the rollable display panel that displays an image, the rollable display panel having a first side and a second side; a printed circuit board disposed along the first side of the rollable display panel, and a plurality of flexible films each having a first end and a second end, the first end of each of the plurality of flexible films connected to the printed circuit board disposed at the first side of the rollable display panel and the second end of each of the plurality of flexible films connected to the second side of the rollable display panel such that the plurality of flexible films overlap the active area of the rollable display panel.

In one embodiment, a display device comprises: a rollable display panel; a plurality of flexible films electrically connected to the display panel, each of the plurality of flexible films having a different length; and a printed circuit board electrically connected to the plurality of flexible films.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1A:
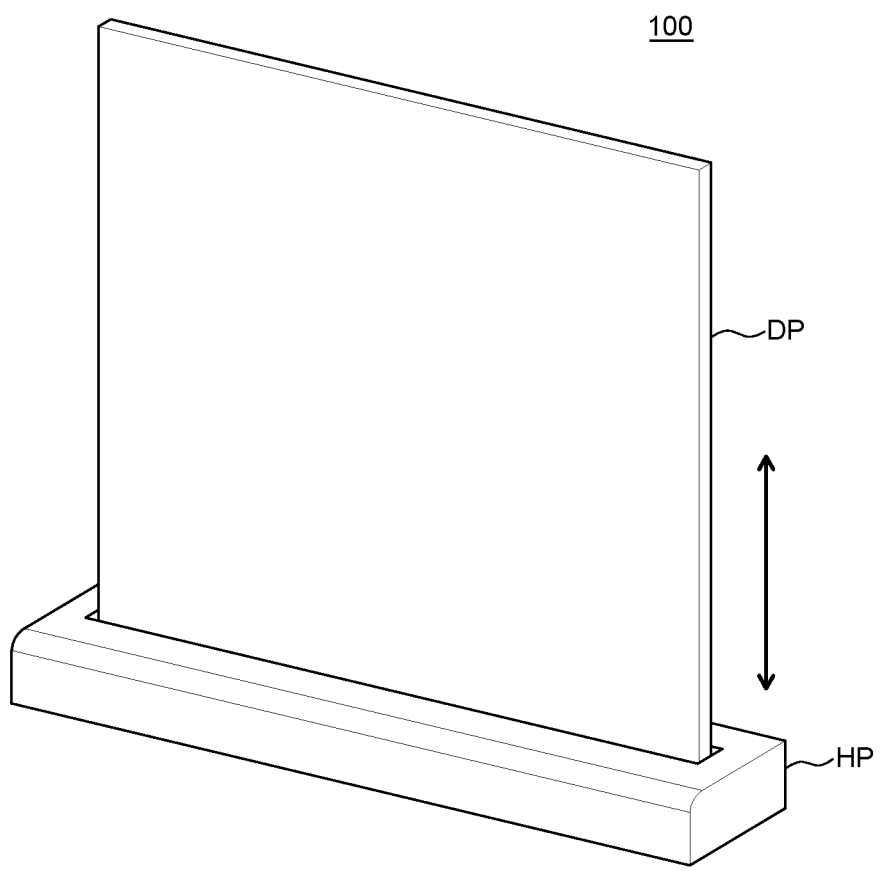
FIG. 1A and FIG. 1B are perspective views of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, a display device according to exemplary embodiments of the present disclosure will be described in detail with reference to accompanying drawings.

<Display Device—Rollable Display Device>

A rollable display device may refer to a display device which can display an image even when rolled up. The rollable display device may have higher flexibility than conventional typical display devices. The rollable display device can be freely changed in shape depending on whether the rollable display device is used or not. Specifically, when the rollable display device is not used, the rollable display device can be housed as rolled up to reduce its volume. When the rollable display device is used, the rolled display device can be unrolled.

Figure 1B:
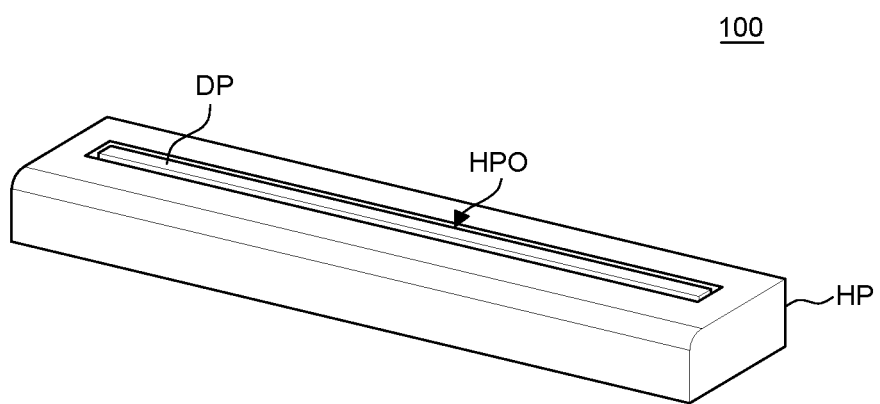

FIG. 1A and FIG. 1B are perspective views of a display device according to an embodiment of the present disclosure. Referring to FIG. 1A and FIG. 1B, a display device 100 according to an embodiment of the present disclosure includes a display part DP and a housing part HP.

The display part DP is configured to display images to a user. For example, display elements, circuits for driving the display elements, lines, and other components may be disposed in the display part DP. Herein, the display device 100 according to an embodiment of the present disclosure is a rollable display device 100. Therefore, the display part DP may be configured to be wound and unwound. For example, the display part DP may include a display panel and a back cover which are flexible so as to be wound or unwound. More details of the display part DP will be described later with reference to FIG. 5 through FIG. 7B.

The housing part HP serves as a case where the display part DP can be housed. The display part DP may be wound and then housed inside the housing part HP, and the display part DP may be unwound and then presented outside the housing part HP.

The housing part HP includes an opening HPO through which the display part DP is rolled into the housing part HP and out of the housing part HP. The display part DP can move up and down through the opening HPO of the housing part HP.

Meanwhile, the display part DP of the display device 100 can transition from a full unwinding state to a full winding state, and vice versa.

FIG. 1A shows a full unwinding state of the display part DP of the display device 100. The full unwinding state refers to a state where the display part DP of the display device 100 is presented outside the housing part HP. That is, the full unwinding state can be defined as a state where the display part DP is unwound to a maximum so as not to be further unwound and presented outside the housing part HP in order for the user to watch images on the display device 100.

FIG. 1B shows a full winding state of the display part DP of the display device 100. The full winding state refers to a state where the display part DP of the display device 100 is housed inside the housing part HP and cannot be further wound. That is, the full winding state can be defined as a state where the display part DP is wound and housed inside the housing part HP when the user does not watch images on the display device 100 because the display part DP is housed inside the housing part HP for the sake of external appearance. Further, in the full winding state where the display part DP is housed inside the housing part HP, the display device 100 is reduced in volume and easy to transport.

Meanwhile, a moving part for winding or unwinding the display part DP to change the display part DP to the full unwinding state or the full winding state is provided.

<Moving Part>

Figure 2:
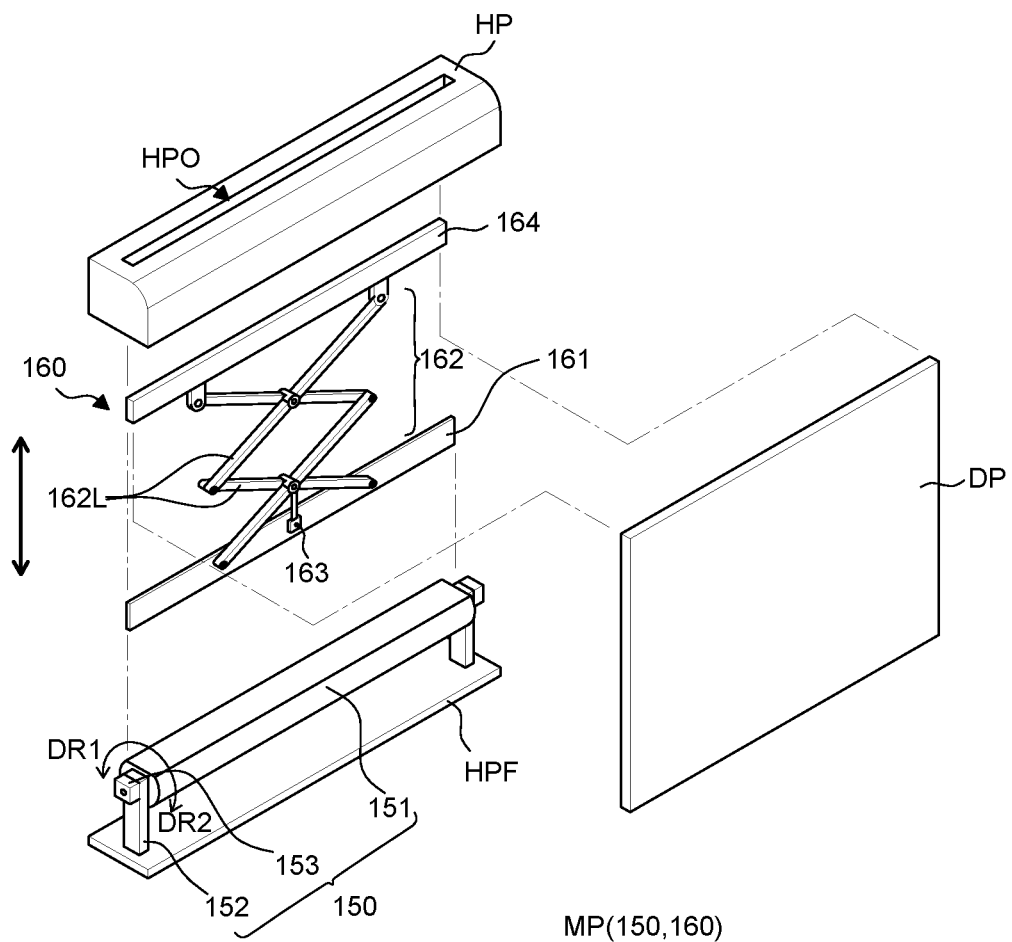
FIG. 2 is an exploded perspective view of the display device according to an embodiment of the present disclosure.
Figure 3:
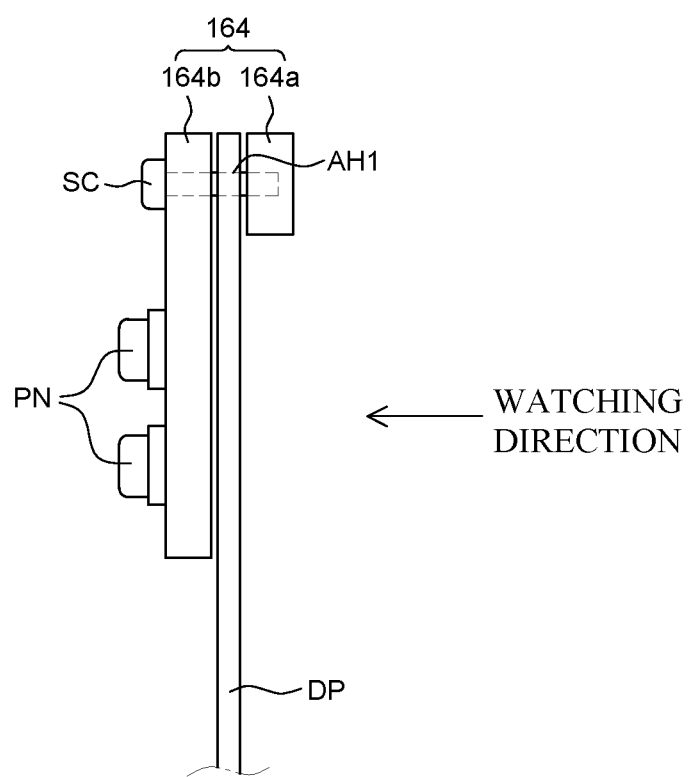
FIG. 3 is a schematic cross-sectional view provided to explain a head bar and a display part of the display device according to an embodiment of the present disclosure.
Figure 4:
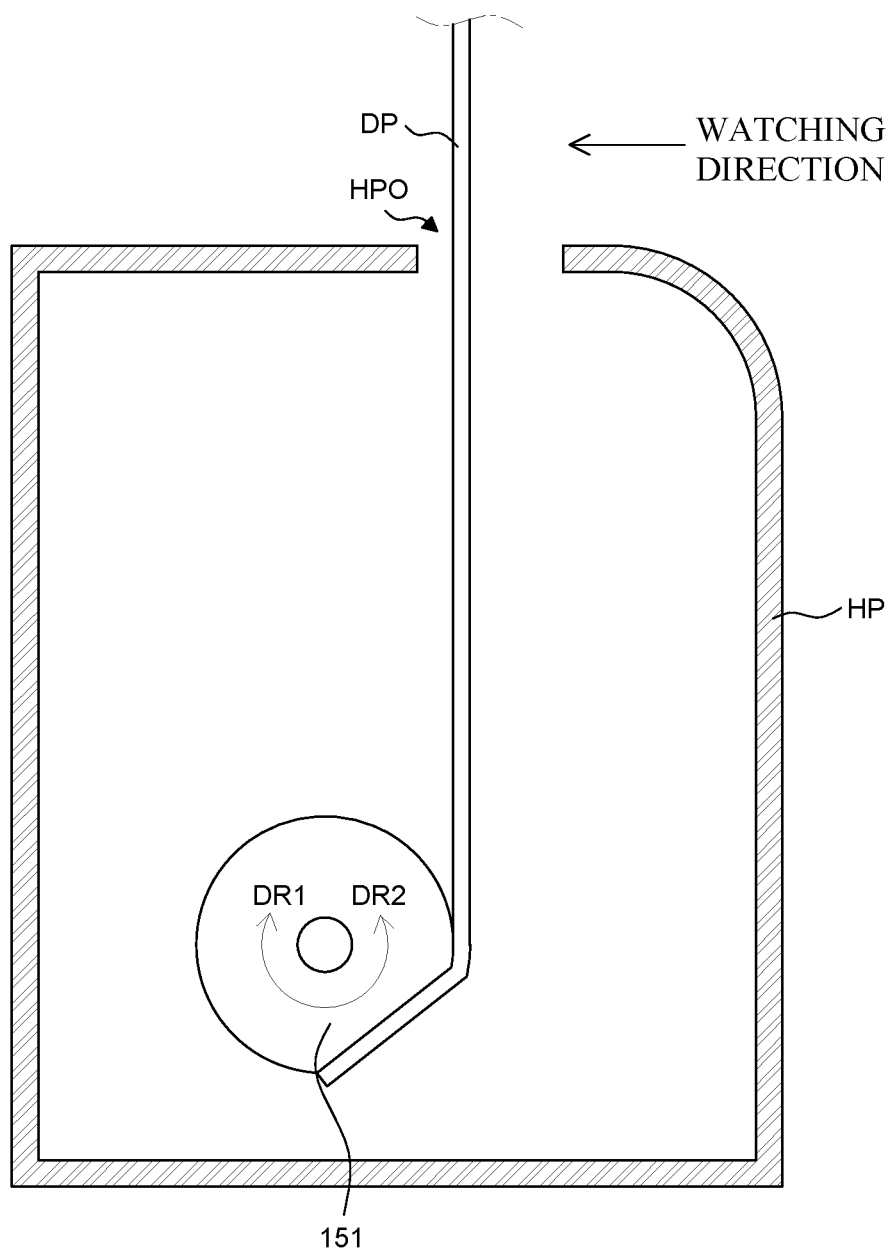
FIG. 4 is a cross-sectional view of the display device according to an embodiment of the present disclosure.

FIG. 2 is an exploded perspective view of the display device according to an embodiment of the present disclosure. FIG. 3 is a schematic cross-sectional view provided to explain a head bar and a display part of the display device according to an embodiment of the present disclosure. FIG. 4 is a cross-sectional view of the display device according to an embodiment of the present disclosure. FIG. 4 is a schematic cross-sectional view provided to explain a roller 151 and the display part DP of the display device 100 according to an embodiment of the present disclosure. For the convenience of description, FIG. 3 illustrates only a head bar 164 and the display part DP and FIG. 4 illustrates only the housing part HP, the roller 151, and the display part DP.

Referring to FIG. 2, a moving part MP includes a roller unit 150 and an elevating unit 160.

The roller unit 150 winds or unwinds the display part DP fixed to the roller unit 150 while rotating in a first direction DR1 or a second direction DR2. The roller unit 150 includes the roller 151, a roller support 152, and a roller rotating unit 153.

The roller 151 is a member around which the display part DP is wound. The roller 151 may have, e.g., a cylindrical shape where at least a part of an outer peripheral surface is flat and another part of the outer peripheral surface is curved. The flat part of the roller 151 refers to a portion where a plurality of flexible films and a printed circuit board of the display part DP is mounted and will be described later with reference to FIG. 8A through FIG. 8C.

The lower edge of the display part DP may be fixed to the roller 151. When the roller 151 rotates, the display part DP whose lower edge is fixed to the roller 151 may be wound around the roller 151. On the contrary, when the roller 151 rotates in the opposite direction, the display part DP wound around the roller 151 may be unwound from the roller 151.

Referring to FIG. 4, the roller 151 has a cylindrical shape overall but may be partially flat. That is, a part of the outer peripheral surface of the roller 151 is flat and the other part of the outer peripheral surface is curved. However, the present disclosure is not limited thereto. The roller 151 may be a completely cylindrical shape or may have any shape around which the display part DP can be wound, but is not limited thereto.

The roller support 152 supports the roller 151 from both sides of the roller 151. Specifically, the roller supports 152 are disposed on a bottom surface HPF of the housing part HP. Further, upper side surfaces of the respective roller supports 152 are combined with both ends of the roller 151. Thus, the roller support 152 may support the roller 151 so as to be spaced apart from the bottom surface HPF of the housing part HP. Herein, the roller 151 may be rotatably combined with the roller support 152.

The roller rotating unit 153 may rotate the roller 151 in the first direction DR1 or the second direction DR2. The roller rotating unit 153 may be disposed on each of the pair of roller supports 152. For example, the roller rotating unit 153 may be a rotary motor that transfers rotatory power to the roller 151 but is not limited thereto.

The elevating unit 160 moves the display part DP up and down according to driving of the roller unit 150. The elevating unit 160 includes a link support 161, a link unit 162, a link elevating unit 163, and the head bar 164.

The link support 161 supports the link unit 162 and the link elevating unit 163. Specifically, the link support 161 supports the link unit 162 which moves up and down so that the display part DP does not collide with the boundary of the opening HPO of the housing part HP. The link support 161 supports the link unit 162 and the display part DP to be movable only up and down but not forward and backward.

The link unit 162 includes a plurality of links 162L hinged to each other. The plurality of links 162L are rotatably hinged to each other and can be moved up and down by the link elevating unit 163. When the link unit 162 moves up and down, the plurality of links 162L may rotate in a direction to be farther from or closer to each other. Details thereof will be described later with reference to FIG. 4.

The link elevating unit 163 may move the link unit 162 up and down. The link elevating unit 163 may rotate the plurality of links 162L of the link unit 162 to be closer to or farther from each other. The link elevating unit 163 may move the link unit 162 up or down to move the display part DP connected to the link unit 162 up or down.

Herein, driving of the link elevating unit 163 is synchronized with driving of the roller rotating unit 153. Thus, the roller unit 150 and the elevating unit 160 may be driven at the same time. For example, when the display part DP transitions from the full unwinding state to the full winding state, the roller unit 150 may be driven to wind the display part DP around the roller 151. At the same time, the elevating unit 160 may rotate the plurality of links 162L of the link unit 162 to move the display part DP down. Further, when the display part DP transitions from the full winding state to the full unwinding state, the roller unit 150 may be driven to unwind the display part DP from the roller 151. At the same time, the elevating unit 160 may rotate the plurality of links 162L of the link unit 162 to move the display part DP up.

The head bar 164 of the elevating unit 160 is fixed to the uppermost end (e.g., topmost end) of the display part DP. The head bar 164 is connected to the link unit 162 and may move the display part DP up and down according to rotation of the plurality of links 162L of the link unit 162. That is, the display part DP can be moved up and down by the head bar 164, the link unit 162, and the link elevating unit 163.

Referring to FIG. 3, the head bar 164 is disposed on the uppermost end of the display part DP to cover a front surface and a rear surface of the display part DP.

The head bar 164 includes a first head bar 164*a* and a second head bar 164*b*. The first head bar 164*a* covers a front surface of the display part DP. The first head bar 164*a* covers only a part of the front surface adjacent to the uppermost edge of the display part DP in order not to cover images displayed on the front surface of the display part DP.

The second head bar 164*b* covers a rear surface of the display part DP. The second head bar 164*b* covers only a part of the rear surface adjacent to the uppermost edge of the display part DP. Since images are not displayed on the rear surface of the display part DP, the second head bar 164*b* may further overlap the display part DP than the first head bar 164*a*.

To fasten the display part DP to the first head bar 164*a* and the second head bar 164*b*, first fastening holes AH1 may be formed in the display part DP. Further, screws SC may penetrate the first fastening holes AH1 to fasten the first head bar 164*a*, the display part DP, and the second head bar 164*b*.

The second head bar 164*b* includes nuts PN (e.g., swage nuts such as PEM nuts) to which the link unit 162 of the elevating unit 160 is fastened. The second head bar 164*b* and link unit 162 of the elevating unit 160 may be fastened to each other by the nuts PN. Therefore, when the link unit 162 of the elevating unit 160 moves up and down, the second head bar 164*b* fastened to the link unit 162 and the first head bar 164*a* and the display part DP fastened to the second head bar 164*b* may move up and down together.

FIG. 3 illustrates that the first head bar 164*a* and the second head bar 164*b* have a straight-line shape. However, the first head bar 164*a* and the second head bar 164*b* may have various shapes. The shape of the first head bar 164*a* and the second head bar 164*b* is not limited thereto.

Hereafter, an operation of the moving part MP will be described in detail with reference to FIG. 4.

Referring to FIG. 4, the lower edge of the display part DP is connected to the roller 151. When the roller 151 is rotated by the roller rotating unit 153 in the first direction DR1, i.e., clockwise, the display part DP may be wound around the roller 151 so that the rear surface of the display part DP can be closely contacted with a surface of the roller 151. That is, the rear surface of the display part DP is closer to the surface of the roller 151 than a front surface of the display part DP that displays an image.

When the roller 151 is rotated by the roller rotating unit 153 in the second direction DR2, i.e., counterclockwise, the display part DP wound around the roller 151 may be unwound from the roller 151 and then presented outside the housing part HP.

In some embodiments, the moving part MP different in structure from the above-described moving part MP may also be applied to the display device 100. That is, the roller unit 150 and the elevating unit 160 may be changed in configuration as long as the display part DP can be wound and unwound. Some of their components may be omitted or other components may be added.

<Display Part>

Figure 5:
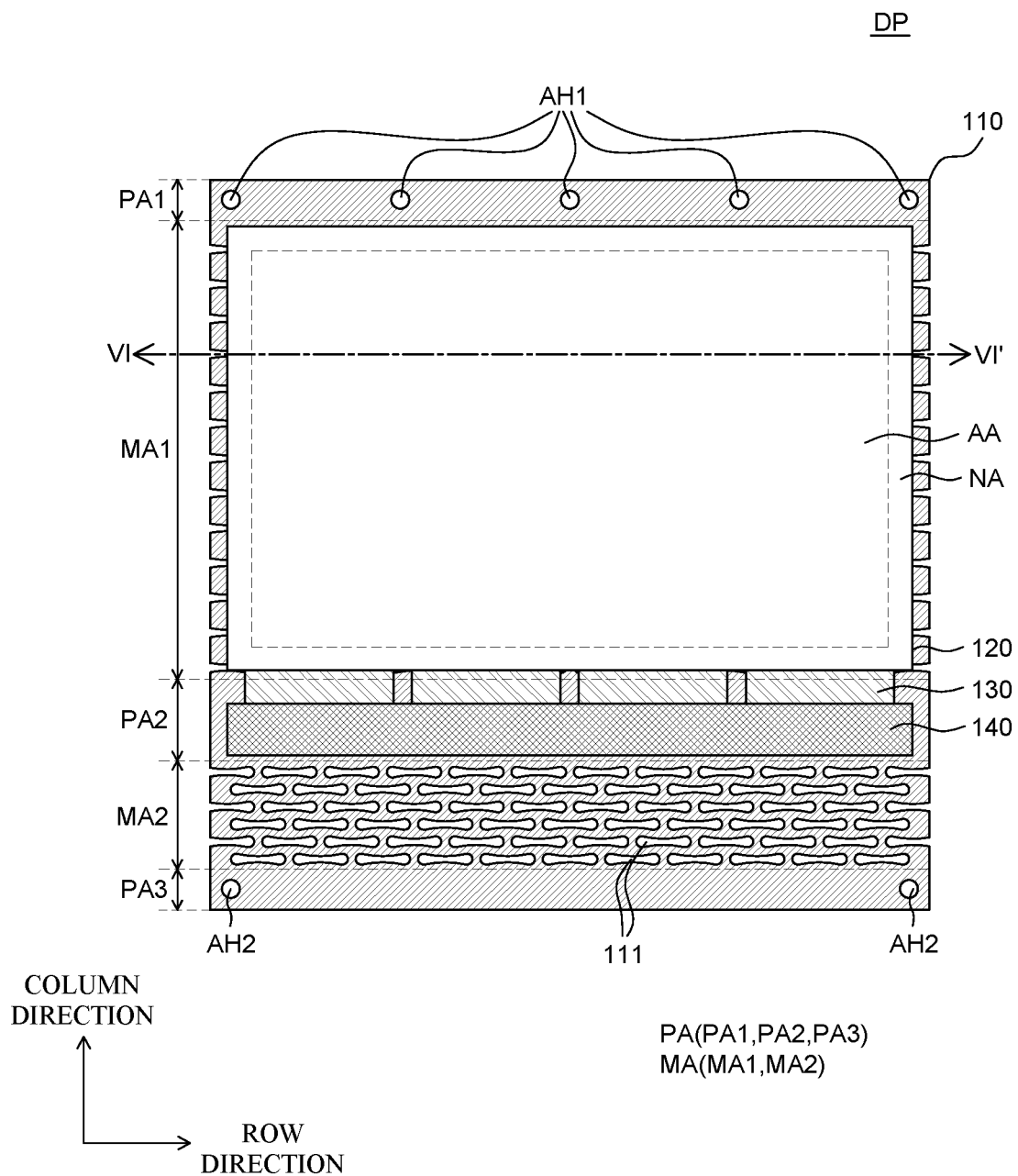
FIG. 5 is a plan view of a display part of the display device according to an embodiment of the present disclosure.
Figure 6:
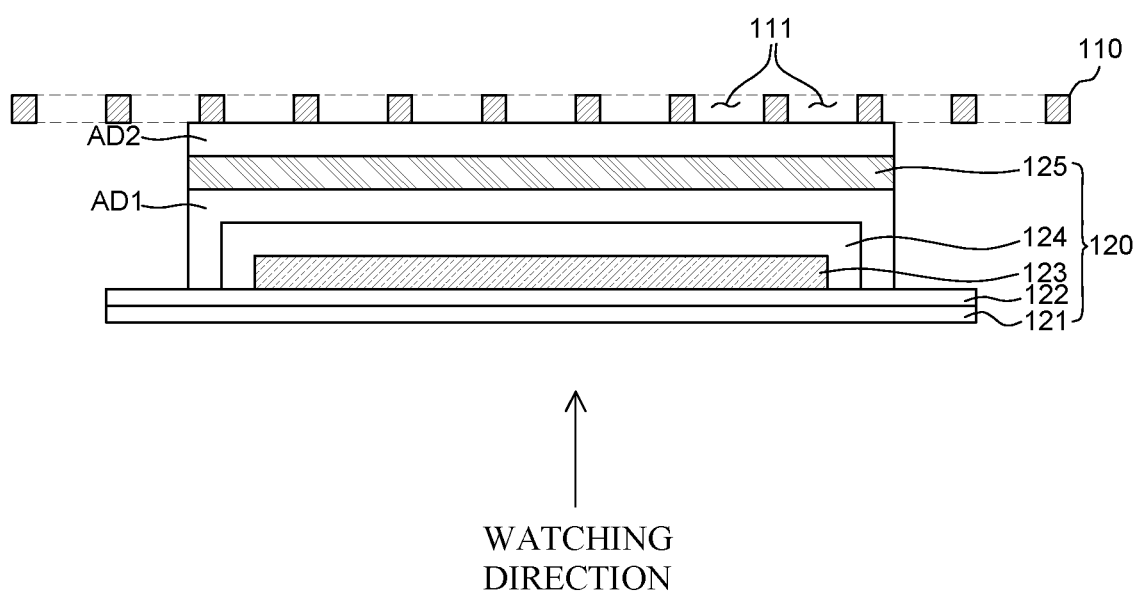
FIG. 6 is a cross-sectional view as taken along a line VI-VI' of FIG. 5 according to an embodiment of the present disclosure.

FIG. 5 is a plan view of a display part of the display device according to an embodiment of the present disclosure. FIG. 6 is a cross-sectional view as taken along a line VI-VI' of FIG. 5.

Referring to FIG. 5, the display part DP includes a back cover 110, a display panel 120, a plurality of flexible films 130, and a printed circuit board 140.

The display panel 120 is configured to display images to the user. In the display panel 120, display elements for displaying images, driving elements for driving the display elements, and lines for transmitting various signals to the display elements and the driving elements may be disposed. The display elements may be defined differently depending on the kind of the display panel 120. For example, if the display panel 120 is an organic light emitting display panel, the display elements may be organic light emitting elements each composed of an anode, an organic emission layer, and a cathode. For example, if the display panel 120 is a liquid crystal display panel, the display elements may be liquid crystal display elements. Hereinafter, the display panel 120 will be assumed as an organic light emitting display panel, but the display panel 120 is not limited to the organic light emitting display panel. Further, since the display device 100 according to an embodiment of the present disclosure is a rollable display device, the display panel 120 may be implemented as a flexible display panel to be wound around or unwound from the roller 151.

The display panel 120 includes an active area AA and a non-active area NA.

The active area AA refers to an area where an image is displayed on the display panel 120. In the active area AA, a plurality of sub-pixels and a circuit for driving the plurality of sub-pixels may be disposed. The plurality of sub-pixels is a minimum unit of the active area AA, and a display element may be disposed on each of the plurality of sub-pixels. For example, an organic light emitting element composed of an anode, an organic emission layer, and a cathode may be disposed on each of the plurality of sub-pixels, but the present disclosure is not limited thereto. Further, the circuit for driving the plurality of sub-pixels may include a driving element and a line. For example, the circuit may be composed of a thin film transistor (TFT), a storage capacitor, a gate line, a data line, etc., but is not limited thereto.

The non-active area NA refers to an area where an image is not displayed. In the non-active area NA, various lines and circuits for driving the organic light emitting elements in the active area AA may be disposed. For example, link lines for transmitting signals to the plurality of sub-pixels and circuits in the active area AA or driver ICs such as a gate driver IC and a data driver IC may be disposed in the non-active area NA. However, the present disclosure is not limited thereto.

The plurality of flexible films 130 includes various components on a flexible base film and serves to supply signals to the plurality of sub-pixels and circuits in the active area AA. The plurality of flexible films 130 may be electrically connected to the display panel 120. The plurality of flexible films 130 is disposed on one end of the non-active area NA of the display panel 120 and supplies power voltage, data voltage, etc. to the plurality of sub-pixels and circuits in the active area AA. FIG. 5 illustrates four flexible films 130. However, the number of plurality of flexible films 130 is not limited thereto and may be changed variously depending on the design.

On the plurality of flexible films 130, driver ICs such as a gate driver IC and a data driver IC may be disposed. The driver ICs are configured to process data for displaying an image and a driving signal for processing the data. The driver ICs may be mounted in a Chip On Glass (COG) method, a Chip On Film (COF) method, or a Tape Carrier Package (TCP) according to a mounting method. For the convenience of description, the driver ICs are described as mounted on the plurality of flexible films 130 in the COG method, but the present disclosure is not limited thereto.

The printed circuit board 140 is disposed on one ends of the plurality of flexible films 130 and connected to the plurality of flexible films 130. The printed circuit board 140 is configured to supply signals to the driver ICs. The printed circuit board 140 supplies various signals such as a drive signal, a data signal, etc. to the driver ICs. In the printed circuit board 140, various components may be disposed. For example, a timing controller, a power supply unit, etc. may be disposed on the printed circuit board 140. FIG. 5 illustrates a single printed circuit board 140. However, the number of printed circuit boards 140 is not limited thereto and may be changed variously depending on the design.

Although not illustrated in FIG. 5, an additional printed circuit board connected to the printed circuit board 140 may be further disposed. For example, the printed circuit board 140 may be referred to as a source printed circuit board (source PCB) S-PCB on which a data driver is mounted. The additional printed circuit board connected to the printed circuit board 140 may be referred to as a control printed circuit board (control PCB) C-PCB on which a timing controller or the like is mounted. The additional printed circuit board may be disposed inside the roller 151, or may be disposed within the housing part HP outside the roller 151, or may be disposed in direct contact with the printed circuit board 140.

The back cover 110 is disposed on rear surfaces of the display panel 120, the plurality of flexible films 130, and the printed circuit board 140 and supports the display panel 120, the plurality of flexible films 130, and the printed circuit board 140. Thus, the back cover 110 may be larger in size than the display panel 120. Therefore, the back cover 110 can protect the other components of the display part DP against the external environment. The back cover 110 may be formed of a rigid material, but at least a part of the back cover 110 may have flexibility so as to be wound or unwound along with the display panel 120. For example, the back cover 110 may be formed of a metal material such as Steel Use Stainless (SUS) or Invar, or plastic. However, the material of the back cover 110 is not limited thereto. The material of the back cover 110 may be changed variously depending on the design as long as it can satisfy property requirements such as the amount of thermal deformation, radius of curvature, rigidity, etc.

Referring to FIG. 6, the display panel 120 includes a substrate 121, a buffer layer 122, a pixel unit 123, an encapsulation layer 124, and an encapsulation substrate 125.

The substrate 121 serves as a base member to support various components of the display panel 120 and may be formed of an insulating material. The substrate 121 may be formed of a flexible material in order for the display panel 120 to be wound or unwound. For example, the substrate 121 may be formed of a plastic material such as polyimide (PI).

The buffer layer 122 may suppress diffusion of moisture and/or oxygen permeating from the outside of the substrate 121. The buffer layer 122 may be formed as a single layer or a multi-layer of silicon oxide (SiOx) and silicon nitride (SiNx) but is not limited thereto.

The pixel unit 123 includes a plurality of organic light emitting elements and circuits for driving the organic light emitting elements. The pixel unit 123 may correspond to the active area AA. Each organic light emitting element may include an anode, an organic emission layer, and a cathode.

The anode may supply holes into the organic emission layer and may be formed of a conductive material having a high work function. For example, the anode may be formed of tin oxide (TO), indium tin oxide (ITO), indium zinc oxide (IZO), indium zinc tin oxide (ITZO), or the like, but is not limited thereto.

The organic emission layer may receive holes from the anode and electrons from the cathode and emit light. The organic emission layer may be one of a red organic emission layer, a green organic emission layer, a blue organic emission layer, and a white organic emission layer depending on the color of light emitted from the organic emission layer. If the organic emission layer is a white organic emission layer, color filters of various colors may be further provided.

The cathode may supply electrons into the organic emission layer and may be formed of a conductive layer having a low work function. For example, the cathode may be formed of one or more materials selected from the group consisting of metals such as magnesium (Mg), silver (Ag), and aluminum (Al) and alloys thereof, but is not limited thereto.

The display panel 120 may be classified into a top emission type or a bottom emission type according to a transmission direction of light emitted from the organic light emitting element.

In the top emission type, light emitted from the organic light emitting element is discharged toward the upper side of the substrate 121 on which the organic light emitting element is formed. If the display panel 120 is of top emission type, a reflective layer may be further provided under the anode. This is to discharge light emitted from the organic light emitting element toward the upper side of the substrate 121, i.e., toward the cathode.

In the bottom emission type, light emitted from the organic light emitting element is discharged toward the lower side of the substrate 121 on which the organic light emitting element is formed. If the display panel 120 is of bottom emission type, the anode may be formed of a transparent conductive material only and the cathode may be formed of a metal material having high reflectivity. This is to discharge light emitted from the organic light emitting element toward the lower side of the substrate 121.

Hereafter, for the convenience of description, the display device 100 according to an embodiment of the present disclosure will be described as a bottom emission type display device, but is not limited thereto.

In the pixel unit 123, a circuit for driving organic light emitting elements is disposed. The circuit may be composed of a TFT, a storage capacitor, a gate line, a data line, a power line, etc. The components of the circuit may be changed variously depending on the design of the display device 100.

The encapsulation layer 124 covering the pixel unit 123 is disposed on the pixel unit 123. The encapsulation layer 124 seals the organic light emitting elements of the pixel unit 123. The encapsulation layer 124 may protect the organic light emitting elements of the pixel unit 123 against external moisture, oxygen, and impacts. The encapsulation layer 124 may be formed by alternately laminating a plurality of inorganic layers and a plurality of organic layers. For example, the inorganic layers may be formed of inorganic materials such as silicon nitride (SiNx), silicon oxide (SiOx), and aluminum oxide (AlOx), but are not limited thereto. For example, the organic layers may be formed of epoxy-based or acryl-based polymers but are not limited thereto.

The encapsulation substrate 125 is disposed on the encapsulation layer 124. The encapsulation substrate 125 protects the organic light emitting elements of the pixel unit 123 together with the encapsulation layer 124. The encapsulation substrate 125 may protect the organic light emitting elements of the pixel unit 123 against external moisture, oxygen, and impacts. The encapsulation substrate 125 may be formed of a metal material which has high corrosion resistance and can be easily processed into foil or thin film. Examples of the metal material may include aluminum (Al), nickel (Ni), chromium (Cr), and an alloy of iron (Fe) and Ni. Since the encapsulation substrate 125 is formed of a metal material, the encapsulation substrate 125 can be implemented in the form of an ultra-thin film and can provide high resistance to external impacts and scratches.

A first adhesive layer AD1 may be disposed between the encapsulation layer 124 and the encapsulation substrate 125. The first adhesive layer AD1 may bond the encapsulation layer 124 and the encapsulation substrate 125. The first adhesive layer AD1 may be formed of an adhesive material and may be a thermosetting or naturally-curable adhesive. For example, the first adhesive layer AD1 may be formed of an optical clear adhesive (OCA), a pressure sensitive adhesive (PSA), or the like, but is not limited thereto.

The first adhesive layer AD1 may be disposed to cover the encapsulation layer 124 and the pixel unit 123. That is, the pixel unit 123 may be sealed by the buffer layer 122 and the encapsulation layer 124 and the encapsulation layer 124 and the pixel unit 123 may be sealed by the buffer layer 122 and the first adhesive layer AD1. The first adhesive layer AD1 may protect the organic light emitting elements of the pixel unit 123 against external moisture, oxygen, and impacts together with the encapsulation layer 124 and the encapsulation substrate 125. Herein, the first adhesive layer AD1 may further contain a moisture absorbent. The moisture absorbent may include hydroscopic particles and may absorb moisture and oxygen from the outside to minimize permeation of moisture and oxygen into the pixel unit 123.

The back cover 110 is disposed on the encapsulation substrate 125. The back cover 110 may be disposed to be in contact with the encapsulation substrate 125 of the display panel 120 to protect the display panel 120. The back cover 110 may be formed of a rigid material to protect the display panel 120.

The back cover 110 includes a plurality of openings 111. The plurality of openings 111 enables the back cover 110 to have flexibility. The plurality of openings 111 may be flexibly deformed and enables the back cover 110 to be wound around or unwound from the roller 151 along with the display panel 120. Details thereof will be described later with reference to FIG. 7A and FIG. 7B.

A second adhesive layer AD2 may be disposed between the encapsulation substrate 125 and the back cover 110. The second adhesive layer AD2 may bond the encapsulation substrate 125 and the back cover 110. The second adhesive layer AD2 may be formed of an adhesive material and may be a thermosetting or naturally-curable adhesive. For example, the second adhesive layer AD2 may be formed of an optical clear adhesive (OCA), a pressure sensitive adhesive (PSA), or the like, but is not limited thereto.

FIG. 6 illustrates that the plurality of openings 111 of the back cover 110 is not filled with the second adhesive layer AD2. However, some or all of the plurality of openings 111 of the back cover 110 may be filled with the second adhesive layer AD2. When the second adhesive layer AD2 fills in the plurality of openings 111 of the back cover 110, a contact area between the second adhesive layer AD2 and the back cover 110 increases. Thus, it is possible to suppress separation therebetween.

Although not illustrated in FIG. 6, a transparent film may be further disposed on a rear surface of the substrate 121. The transparent film may function to protect a front surface of the display panel 120 or minimize reflection of external light incident into the display panel 120. For example, the transparent film may be at least one of a polyethylene-terephthalate (PET) film, an anti-reflection film, a polarizing film, and a transmittance controllable film, but is not limited thereto.

Hereafter, the back cover 110 will be described in more detail with reference to FIG. 7A and FIG. 7B.

<Detailed Configuration of Back Cover>

Figure 7A:
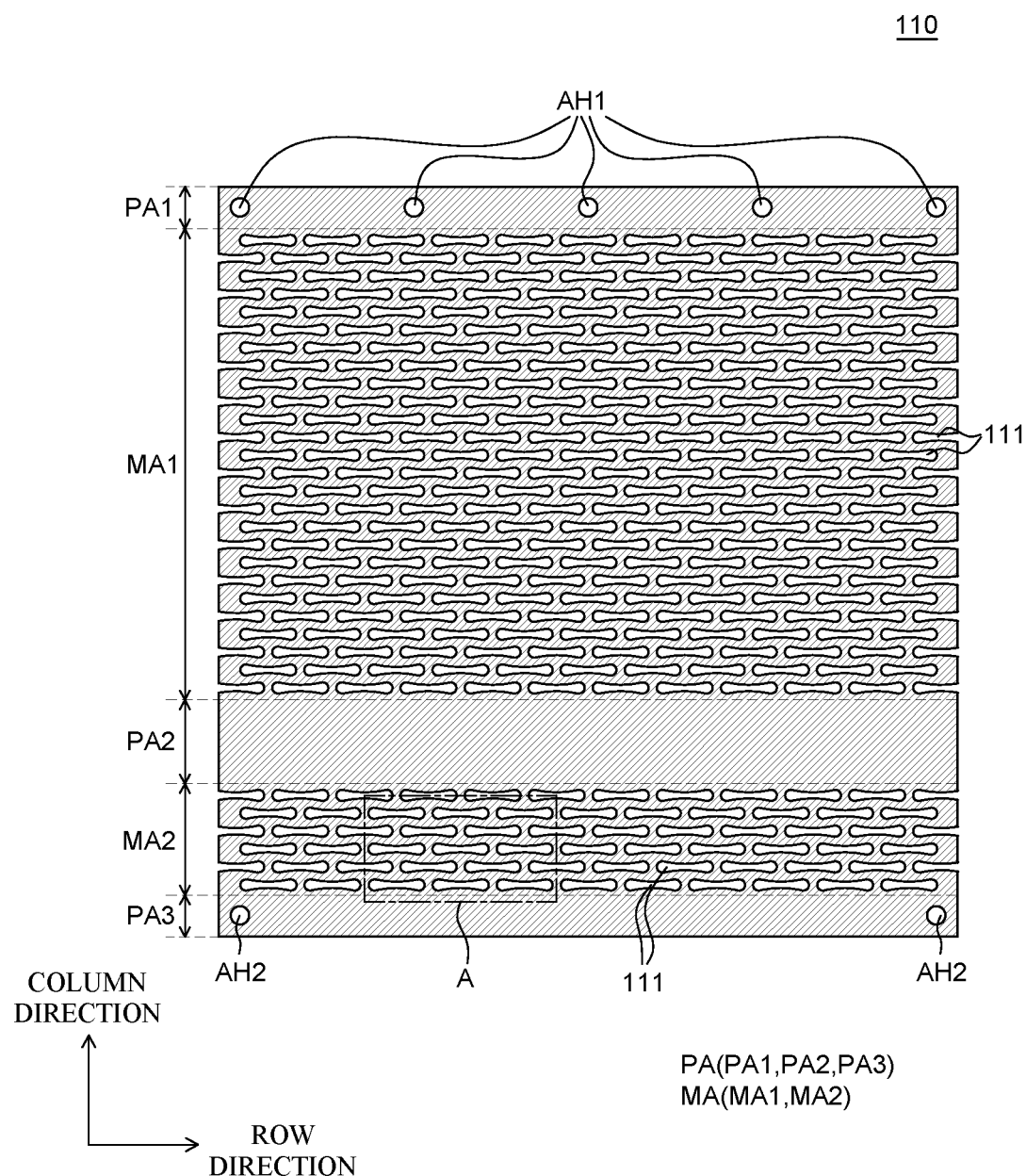
FIG. 7A is a plan view of a back cover of the display device according to an embodiment of the present disclosure.

FIG. 7A is a plan view of a back cover of the display device according to an embodiment of the present disclosure. FIG. 7B is an enlarged view of a region "A" of FIG. 7A.

Referring to FIG. 7A, the back cover 110 includes a plurality of supporting areas PA and a plurality of flexible areas MA. In the plurality of supporting areas PA, the plurality of openings 111 is not disposed. That is, the supporting areas PA lack openings 111. In the plurality of flexible areas MA, the plurality of openings 111 are disposed. Specifically, a first supporting area PA1, a first flexible area MA1, a second supporting area PA2, a second flexible area MA2, and a third supporting area PA3 are disposed in sequence from the uppermost end of the back cover 110. Herein, the back cover 110 is wound or unwound in a column direction. Thus, the plurality of supporting areas PA and the plurality of flexible areas MA may be disposed in the column direction.

The first supporting area PA1 is the uppermost area of the back cover 110 and fastened to the head bar 164. The first supporting area PA1 includes the first fastening holes AH1 so as to be fastened to the head bar 164. Further, as described above with reference to FIG. 3, the screws SC penetrating the head bar 164 and the first fastening holes AH1 may be provided to fasten the head bar 164 to the first supporting area PA1 of the back cover 110. Since the first supporting area PA1 is fastened to the head bar 164, the back cover 110 can move up or down at the same time when the link unit 162 fastened to the head bar 164 moves up or down. The display panel 120 attached to the back cover 110 can also move up or down. FIG. 7A illustrates five first fastening holes AH1, but the number of first fastening holes AH1 is not limited thereto. Further, FIG. 7A illustrates that the back cover 110 is fastened to the head bar 164 using the first fastening holes AH1. However, the present disclosure is not limited thereto. The back cover 110 may be fastened to the head bar 164 without fastening holes.

The first flexible area MA1 is extended from the first supporting area PA1 to the lower side of the back cover 110. In the first flexible area MA1, the plurality of openings 111 are disposed. The display panel 120 is attached to the first flexible area MA1. Specifically, the first flexible area MA1 is wound around or unwound from the roller 151 along with the display panel 120. The first flexible area MA1 may overlap at least the display panel 120 among the other components of the display part DP.

The second supporting area PA2 is extended from the first flexible area MA1 to the lower side of the back cover 110. The plurality of flexible films 130 connected to one end of the display panel 120 and the printed circuit board 140 are attached to the second supporting area PA2.

The second supporting area PA2 may support the plurality of flexible films 130 and the printed circuit board 140 to maintain a flat state and not to be bent to the roller 151. This is to protect the plurality of flexible films 130 and the printed circuit board 140.

When the second supporting area PA2 is wound around the roller 151, the roller 151 may have a flat part of the outer peripheral surface which is in contact with the second supporting area PA2. Therefore, the second supporting area PA2 can constantly maintain a flat state regardless of whether it is wound around or unwound from the roller 151. The plurality of flexible films 130 and the printed circuit board 140 disposed in the second supporting area PA2 can also maintain a flat state.

The second flexible area MA2 is extended from the second supporting area PA2 to the lower side of the back cover 110. In the second flexible area MA2, the plurality of openings 111 are disposed. The second flexible area MA2 is extended to enable the active area AA of the display panel 120 to be presented outside the housing part HP. For example, when the back cover 110 and the display panel 120 are in the full unwinding state, an area ranging from the third supporting area PA3 of the back cover 110 fixed to the roller 151 to the second supporting area PA2 to which the plurality of flexible films 130 and the printed circuit board 140 are attached may be disposed inside the housing part HP. At the same time, the first flexible area MA1 to which the display panel 120 is attached may be presented outside the housing part HP. In this case, if a length from the third supporting area PA3 fixed to the roller 151 to the second flexible area MA2 and the second supporting area PA2 is less than a length from the third supporting area PA3 to the opening HPO of the housing part HP, a part of the first flexible area MA1 to which the display panel 120 is attached may be disposed inside the housing part HP. Since a part of a lower end of the active area AA of the display panel 120 is disposed inside the housing part HP, it may be difficult to watch images. Therefore, the length from the third supporting area PA3 fixed to the roller 151 to the second flexible area MA2 and the second supporting area PA2 may be designed to be equal to the length from the third supporting area PA3 fixed to the roller 151 to the opening HPO of the housing part HP.

The third supporting area PA3 is extended from the second flexible area MA2 to the lower side of the back cover 110. The third supporting area PA3 is the lowermost area (e.g., bottommost area) of the back cover 110 and fastened to the roller 151. The third supporting area PA3 may include second fastening holes AH2 so as to be fastened to the roller 151. For example, screws SC penetrating the roller 151 and the second fastening holes AH2 may be provided to fasten the roller 151 to the third supporting area PA3 of the back cover 110. Since the third supporting area PA3 is fastened to the roller 151, the back cover 110 may be wound around or unwound from the roller 151. FIG. 7A illustrates two second fastening holes AH2, but the number of second fastening holes AH2 is not limited thereto.

Meanwhile, the plurality of openings 111 formed in the plurality of flexible areas MA are not formed in the first supporting area PA1, the second supporting area PA2, and the third supporting area PA3. Specifically, only the first fastening holes AH1 and the second fastening holes AH2 are formed in each of the first supporting area PA1 and the third supporting area PA3. However, the plurality of openings 111 formed in the plurality of flexible areas MA are not formed in the first supporting area PA1, the second supporting area PA2, and the third supporting area PA3. Further, the first fastening holes AH1 and the second fastening holes AH2 are different in shape from the plurality of openings 111. The first supporting area PA1 is fixed to the head bar 164, the second supporting area PA2 supports the plurality of flexible films 130 and the printed circuit board 140, and the third supporting area PA3 is fixed to the roller 151. Thus, the first supporting area PA1, the second supporting area PA2, and the third supporting area PA3 need to have higher rigidity than the plurality of flexible areas MA. Specifically, since the first supporting area PA1, the second supporting area PA2, and the third supporting area PA3 have rigidity, the first supporting area PA1 and the third supporting area PA3 can be securely fixed to the head bar 164 and the roller 151. Further, the second supporting area PA2 can maintain a flat state of the plurality of flexible films 130 and the printed circuit board 140 so as not to be bent to protect the plurality of flexible films 130 and the printed circuit board 140. Therefore, the display part DP is fixed to the roller 151 and the head bar 164 of the moving part MP and can move in and out of the housing part HP according to an operation of the moving part MP. Also, the display part DP can protect the plurality of flexible films 130 and the printed circuit board 140.

FIG. 7A illustrates that the plurality of supporting areas PA and the plurality of flexible areas MA of the back cover 110 are disposed in sequence in the column direction. However, if the back cover 110 is wound in a row direction, the plurality of supporting areas PA and the plurality of flexible areas MA may be disposed in the row direction.

During winding or unwinding of the display part DP, the plurality of openings 111 disposed in the plurality of flexible areas MA of the back cover 110 may be deformed by stress applied to the display part DP. Specifically, during winding or unwinding of the display part DP, the plurality of flexible areas MA of the back cover 110 may be deformed as the plurality of openings 111 contracts or expands. Further, since the plurality of openings 111 contracts or expands, a slip phenomenon of the display panel 120 disposed on the plurality of flexible areas MA of the back cover 110 can be minimized. Therefore, stress applied to the display panel 120 can be minimized.

During winding of the display panel 120 and the back cover 110, there is a difference in length between the display panel 120 and the back cover 110 which are wound around the roller 151. This is because there is a difference in radius of curvature between the display panel 120 and the back cover 110. For example, when the back cover 110 and the display panel 120 are wound around the roller 151, the back cover 110 and the display panel 120 may need different lengths to be wound once around the roller 151. That is, the display panel 120 is disposed farther from the roller 151 than the back cover 110, and, thus, the display panel 120 may need a longer length to be wound once around the roller 151 than the back cover 110. As such, a difference in radius of curvature during winding of the display part DP causes a difference in length for winding of the back cover 110 and the display panel 120. Thus, the display panel 120 attached to the back cover 110 may slip and move from its original position. In this case, a phenomenon that the display panel 120 slips from the back cover 110 due to differences in stress and radius of curvature caused by winding may be defined as slip phenomenon. If slip occurs excessively, the display panel 120 may be detached from the back cover 110 or defects such as cracks may occur.

In the display device 100 according to an embodiment of the present disclosure, even when the display part DP is applied with stress by being wound or unwound, the plurality of openings 111 of the back cover 110 may be flexibly deformed to reduce stress applied to the back cover 110 and the display panel 120. For example, when the back cover 110 and the display panel 120 are wound around the roller 151 along the column direction, stress that deforms the back cover 110 and the display panel 120 in up and down directions may be applied thereto. In this case, the plurality of openings 111 of the back cover 110 may expand in the up and down (e.g., vertical) directions of the back cover 110 and the length of the back cover 110 may also be flexibly changed. Therefore, during winding of the back cover 110 and the display panel 120, a difference in length between the back cover 110 and the display panel 120 caused by a difference in radius of curvature may be compensated for by the plurality of openings 111 of the back cover 110. Further, during winding of the back cover 110 and the display panel 120, the plurality of openings 111 may be deformed to reduce stress applied to the display panel 120 from the back cover 110.

Figure 7B:
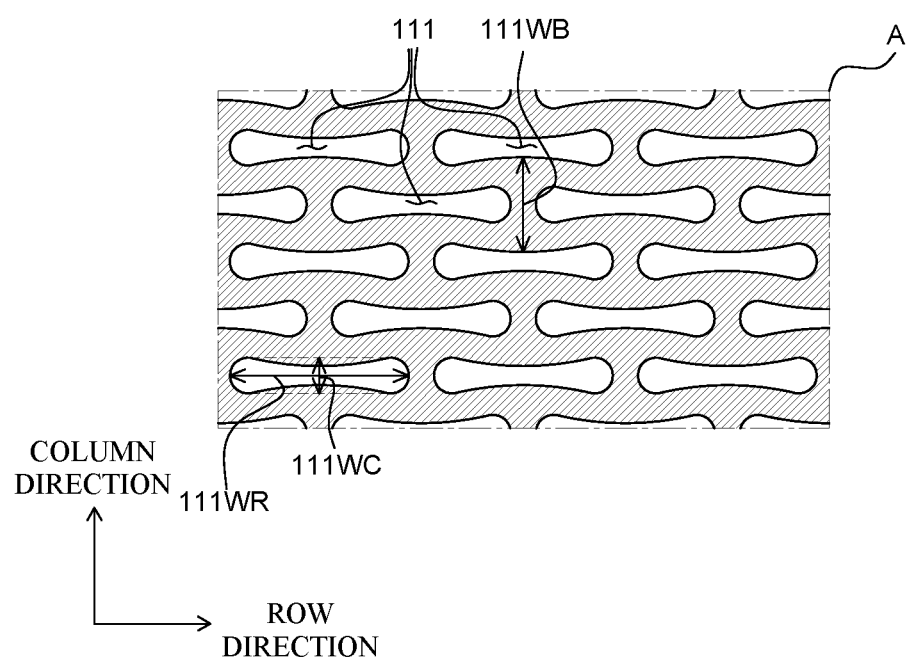
FIG. 7B is an enlarged view of a region "A" of FIG. 7A according to an embodiment of the present disclosure.

Referring to FIG. 7A and FIG. 7B, the plurality of openings 111 are misaligned with the plurality of openings 111 of adjacent rows. For example, the plurality of openings 111 of one row is misaligned with the plurality of openings 111 of rows adjacent to the row. Specifically, the centers of the plurality of openings 111 in odd-numbered rows may be misaligned with the centers of the plurality of openings 111 in even-numbered rows by as much as, e.g., ½ of a row-direction width 111WR of each opening 111. The disposition of the plurality of openings 111 shown in FIG. 7A is just an example but is not limited thereto.

Since the plurality of openings 111 is maligned with each other, a distance 111WB between concentric openings 111 in the column direction can be minimized Specifically, in the flexible areas MA, an area between concentric openings 111 in the column direction may have rigidity. Further, during winding of the back cover 110, the back cover 110 needs to be bent in the column direction. Thus, as the length 111WB of the area between the concentric openings 111 in the column direction increases, it may become more difficult for the back cover 110 to be bent in the column direction. Since the plurality of openings 111 is misaligned by row, the distance 111WB between the concentric openings 111 in the column direction can be minimized, compared to a case where the openings 111 are not misaligned by row. Also, the area between the plurality of openings 111 can be minimized. The distance 111WB between the concentric openings 111 in the column direction is minimized and the flexible areas MA are extended continuously in the column direction to remove the area where the plurality of openings 111 is not disposed. Thus, the length 111WB of the area between the plurality of openings 111 having rigidity in the column direction can be minimized. Therefore, the rigidity of the back cover 110 can be improved without interrupting winding or unwinding of the back cover 110.

Referring to FIG. 7B, the plurality of openings 111 has the row-direction maximum width 111WR which is larger than a column-direction maximum width 111WC. That is, as shown in FIG. 7B, the maximum width 111WR of the plurality of openings 111 in a transverse direction may be larger than the maximum width 111WC of the plurality of openings 111 in a vertical direction.

As the row-direction width 111WR of the plurality of openings 111 increases, it may become easier for the back cover 110 to be flexibly deformed. Specifically, during winding of the back cover 110, the back cover 110 may be bent in the column direction and stress may be applied to expand the plurality of openings 111 in the column direction. In this case, if the row-direction width 111WR of the plurality of openings 111 increases, when the plurality of openings 111 is stretched in the column direction, the column-direction width 111WC of the plurality of openings 111 may increase. Further, as the plurality of openings 111 expands in the column direction, stress applied to the plurality of flexible areas MA may be reduced. Therefore, by increasing the row-direction width 111WR of the plurality of openings 111, the plurality of flexible areas MA of the back cover 110 can be easily wound or unwound and stress applied to the plurality of flexible areas MA can be reduced.

As the column-direction width 111WC of the plurality of openings 111 increases, it becomes easier to process the plurality of openings 111. However, when the column-direction width 111WC of the plurality of openings 111 increases, the aperture ratio of the plurality of openings 111 in the plurality of flexible areas MA increases. Also, a contact area between the display panel 120 and the back cover 110 which are attached to the plurality of flexible areas MA decreases. In this case, if an overlap area between the display panel 120 and the back cover 110, i.e., a contact area between the back cover 110 and the second adhesive layer AD2, decreases, the back cover 110 may be separated from the second adhesive layer AD2. Therefore, the column-direction width 111WC of the plurality of openings 111 may be controlled to control adhesive strength between the display panel 120 and the back cover 110 in order to suppress separation therebetween. Further, the row-direction width 111WR of the plurality of openings 111 may be controlled such that the back cover 110 can have high flexibility.

FIG. 7A and FIG. 7B illustrate the plurality of openings 111 as having a dumbbell shape where ends of the openings are larger than portions of the openings between the ends. However, if the row-direction maximum width 111WR of the plurality of openings 111 is larger than the column-direction maximum width 111WC during column-direction winding of the back cover 110, the shape of the plurality of openings 111 is not limited thereto. For example, the plurality of openings 111 may have at least one of a rectangular shape, an oval shape, a ribbon shape, a dumbbell shape, or a diamond shape, but is not limited thereto.

Hereafter, winding of the back cover 110 including the plurality of supporting areas PA and flexible areas MA around the roller 151 along with the display panel 120 will be described in detail with reference to FIG. 8A through FIG. 8C.

<Winding of Back Cover and Display Panel>

Figure 8A:
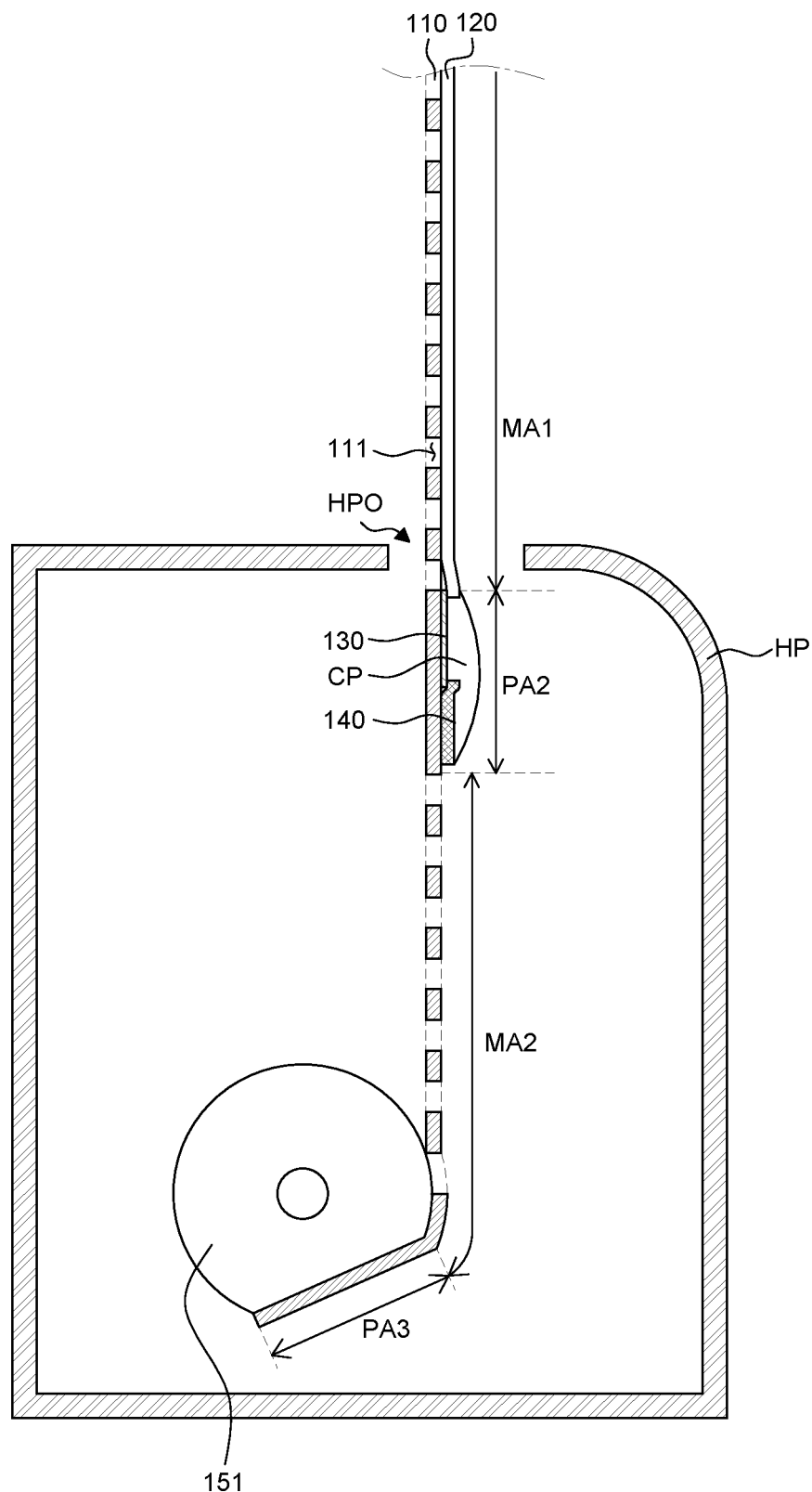
FIG. 8A through FIG. 8C are cross-sectional views of the display device according to an embodiment of the present disclosure.
Figure 8B:
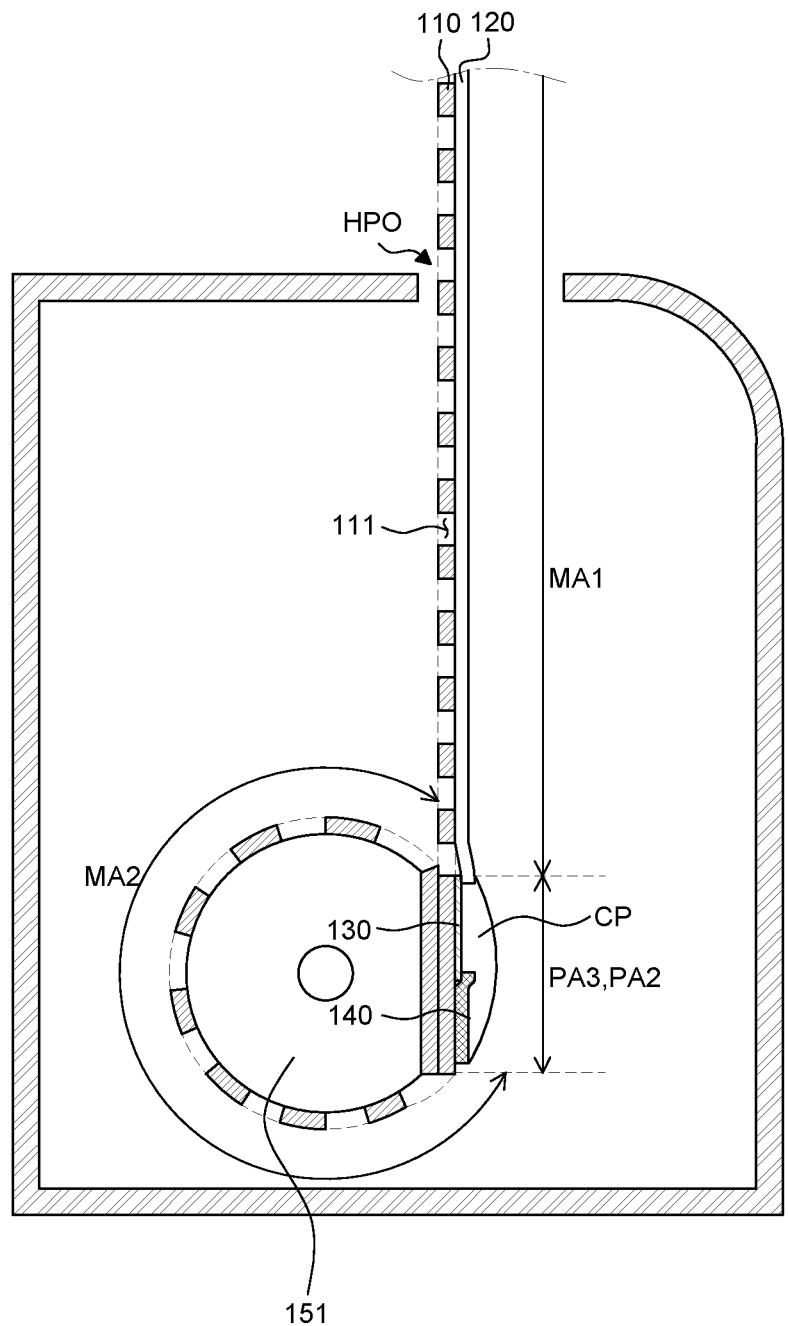
Figure 8C:
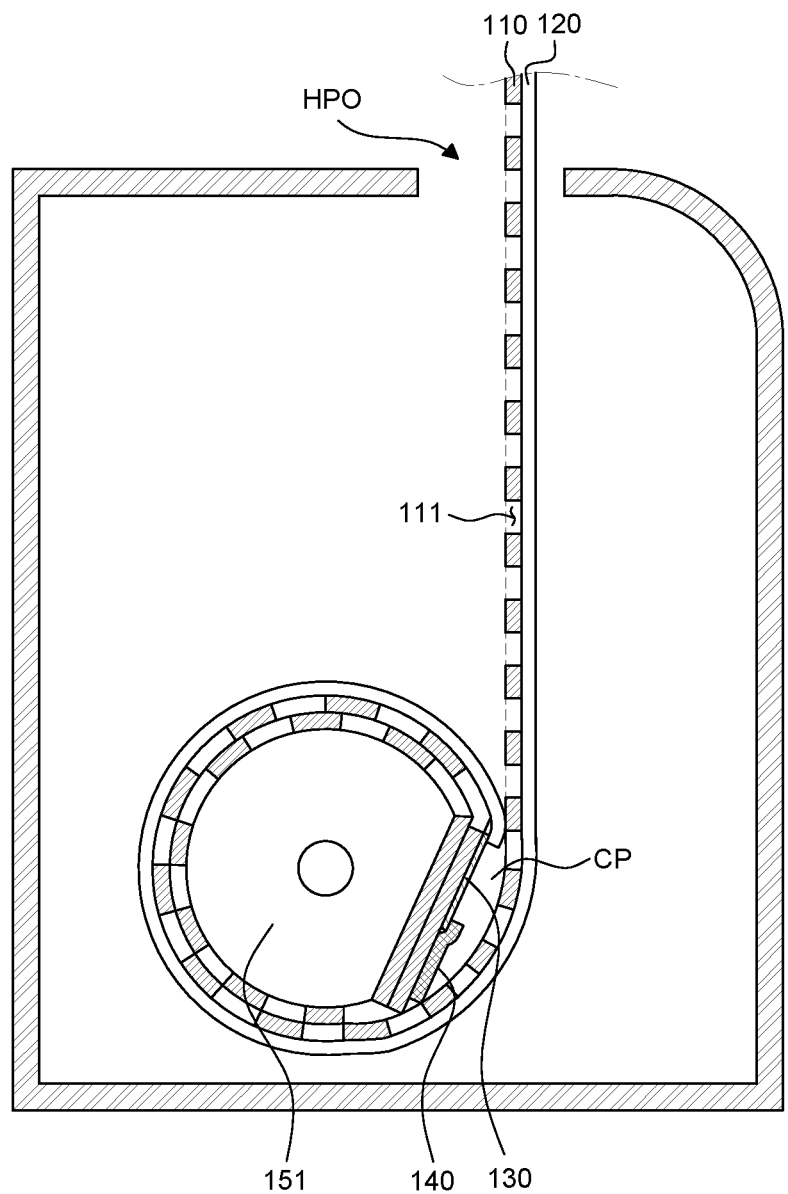

FIG. 8A through FIG. 8C are cross-sectional views of the display device according to an embodiment of the present disclosure. FIG. 8A is a cross-sectional view of the back cover 110 fully unwound from the roller 151. FIG. 8B is a cross-sectional view of the back cover 110 whose third supporting area PA3, second flexible area MA2 and second supporting area PA2 are wound around the roller 151. FIG. 8C is a cross-sectional view of the back cover 110 whose third supporting area PA3, second flexible area MA2, second supporting area PA2 and first flexible area MA1 are wound around the roller 151.

Referring to FIG. 8A, the roller 151 has a cylindrical shape overall but may be partially flat. That is, a part of the outer peripheral surface of the roller 151 is flat and the other part of the outer peripheral surface is curved.

The third supporting area PA3 is fastened to the flat part of the roller 151. Except the third supporting area PA3 fastened to the roller 151, the other area of the back cover 110 extended from the third supporting area PA3 may be flat.

A cover part CP is further disposed on the plurality of flexible films 130 and the printed circuit board 140 disposed in the second supporting area PA2. The cover part CP may be disposed to cover the plurality of flexible films 130 and the printed circuit board 140 and may have a convex shape. The cover part CP may protect the printed circuit board 140 and the plurality of flexible films 130 and may be formed of an insulating material such as resin but is not limited thereto.

As described above with reference to FIG. 7A, when the back cover 110 is in the full unwinding state, the third supporting area PA3, the second flexible area MA2 and the second supporting area PA2 of the back cover 110 may be disposed inside the housing part HP. In this case, the first flexible area MA1 may be presented outside the housing part HP.

Referring to FIG. 8B, the third supporting area PA3, the second flexible area MA2 and the second supporting area PA2 of the back cover 110 are wound around the roller 151. Further, the first flexible area MA1 extended from the second supporting area PA2 is unwound from the roller 151.

In the flat part of the outer peripheral surface of the roller 151, the third supporting area PA3 and the second supporting area PA2 are disposed, and in the curved part, the second flexible area MA2 is disposed.

The second supporting area PA2 to which the printed circuit board 140 and the plurality of flexible films 130 are attached is wound on the flat part of the roller 151. Thus, the printed circuit board 140 and the plurality of flexible films 130 in the second supporting area PA2 can maintain a flat state without being bent. Therefore, the plurality of flexible films 130 and the printed circuit board 140 can constantly maintain a flat state regardless of winding or unwinding of the display part DP. Also, damage to the plurality of flexible films 130 and the printed circuit board 140 caused by bending can be suppressed.

Referring to FIG. 8C, the third supporting area PA3, the second flexible area MA2 and the second supporting area PA2 of the back cover 110 are wound around the roller 151 and a part of the first flexible area MA1 is further wound around the roller 151.

The part of the first flexible area MA1 may be wound to overlap the curved part of the roller 151. That is, the part of the first flexible area MA1 wound on the second flexible area MA2 already wound around the curved part of the roller 151 may be bent along the shape of the curved part of the roller 151.

The other part of the first flexible area MA1 may be wound to overlap the flat part of the roller 151. Specifically, the first flexible area MA1 may be wound around the roller 151 so as to cover the second supporting area PA2. In this case, the cover part CP may be disposed between the first flexible area MA1 and the second supporting area PA2. Therefore, the first flexible area MA1 may be wound to cover the cover part CP of the second supporting area PA2 and bent along the shape of the cover part CP. Since the cover part CP has a curved surface, the first flexible area MA1 may also be bent along the shape of the curved surface. Particularly, an upper curved surface of the cover part CP corresponds in shape to the roller 151. Thus, a cross section of the first flexible area MA1 wound around the roller 151 may have a substantially circular shape.

In the display device 100 according to an embodiment of the present disclosure, the back cover 110 including the plurality of openings 111 is disposed on the rear surface of the display panel 120 to support and protect the display panel 120. The back cover 110 may be formed of a metal material and thus may have rigidity. Also, the first flexible area MA1 of the back cover 110 in which the display panel 120 is disposed includes the plurality of openings 111, and, thus, the back cover 110 may have improved flexibility. Therefore, in the full unwinding state in which the display part DP of the display device 100 is presented outside the housing part HP, the back cover 110 formed of a rigid material and having high rigidity may support the display panel 120 to be spread flat. In the full winding state in which the display part DP of the display device 100 is housed inside the housing part HP, the back cover 110 having high flexibility due to the plurality of openings 111 may be wound around the roller 151 and housed together with the display panel 120.

Further, in the display device 100 according to an embodiment of the present disclosure, the row-direction width 111WR of the plurality of openings 111 may be controlled such that the back cover 110 can have flexibility. Further, stress applied to the back cover 110 during winding can be reduced. Specifically, during winding of the back cover 110 and the display panel 120 around the roller, the back cover 110 may be bent in the column direction and stress may be applied to expand the plurality of openings 111 in the column direction. Since the plurality of openings 111 has a large row-direction width 111WR, the plurality of openings 111 can easily expand in the column direction during winding of the back cover 110 and the display panel 120 around the roller 151. Also, stress applied to the back cover 110 can be reduced. Therefore, in the display device 100 according to an embodiment of the present disclosure, by controlling the row-direction width 111WR of the plurality of openings 111, the flexibility of the back cover 110 can be improved. Thus, the back cover 110 and the display panel 120 can be easily wound around the roller 151. Further, since the plurality of openings 111 can reduce stress applied to the back cover 110 and the display panel 120 while expanding in the column direction, damage to the display panel 120 can be suppressed.

Furthermore, in the display device 100 according to an embodiment of the present disclosure, the column-direction width 111WC of the plurality of openings 111 may be controlled to control adhesive strength between the back cover 110 and the display panel 120. Specifically, the display panel 120 is attached to the first flexible area MA1 of the back cover 110. In this case, as the aperture ratio of the plurality of openings 111 in the plurality of flexible areas MA increases, a contact area between the display panel 120 and the back cover 110 decreases. Thus, the adhesive strength between the display panel 120 and the back cover 110 may decrease. However, in the display device 100 according to an embodiment of the present disclosure, the plurality of openings 111 in the back cover 110 has a small column-direction width 111WC. Thus, the aperture ratio of the plurality of openings 111 can be reduced and the contact area between the display panel 120 and the back cover 110 can be increased. As the contact area between the display panel 120 and the back cover 110 increases, the adhesive strength between the display panel 120 and the back cover 110 can be improved. Therefore, in the display device 100 according to an embodiment of the present disclosure, by controlling the column-direction width 111WC of the plurality of openings 111, the adhesive strength between the back cover 110 and the display panel 120 can be maintained at a certain level or more to suppress separation therebetween.

In the display device 100 according to an embodiment of the present disclosure, the second supporting area PA2 can constantly maintain a flat state. Thus, damage to the plurality of flexible films 130 and the printed circuit board 140 attached to the second supporting area PA2 can be minimized. The second supporting area PA2 refers to an area where the plurality of flexible films 130 and the printed circuit board 140 are attached and can constantly maintain a flat state. Since the second supporting area PA2 needs to constantly maintain a flat state, there is no need to form the plurality of openings 111 in the second supporting area PA2. Specifically, during winding of the back cover 110 around the roller 151, the back cover 110 may be bent and wound along the shape of the roller 151. Thus, in the display device 100 according to an embodiment of the present disclosure, the roller 151 includes the flat part on which the second supporting area PA2 is wound. Therefore, the second supporting area PA2 can be wound flat on the roller 151. The second supporting area PA2 can constantly maintain a flat state regardless of whether it is wound around or unwound from the roller 151. Therefore, the plurality of flexible films 130 and the printed circuit board 140 attached to the second supporting area PA2 can constantly maintain a flat state. For example, during full unwinding of the display part DP, the plurality of flexible films 130 and the printed circuit board 140 can be maintained flat by the second supporting area PA2 having high rigidity. During full winding of the display part DP, the plurality of flexible films 130 and the printed circuit board 140 are mounted on the flat part of the roller 151 and thus can be maintained flat. Therefore, in the display device 100 according to an embodiment of the present disclosure, repeated bending of the plurality of flexible films 130 and the printed circuit board 140 can be suppressed. Thus, damage to the plurality of flexible films 130 and the printed circuit board 140 can be minimized <Display Panel and Back Cover Capable of being Wound in Row Direction>

Figure 9:
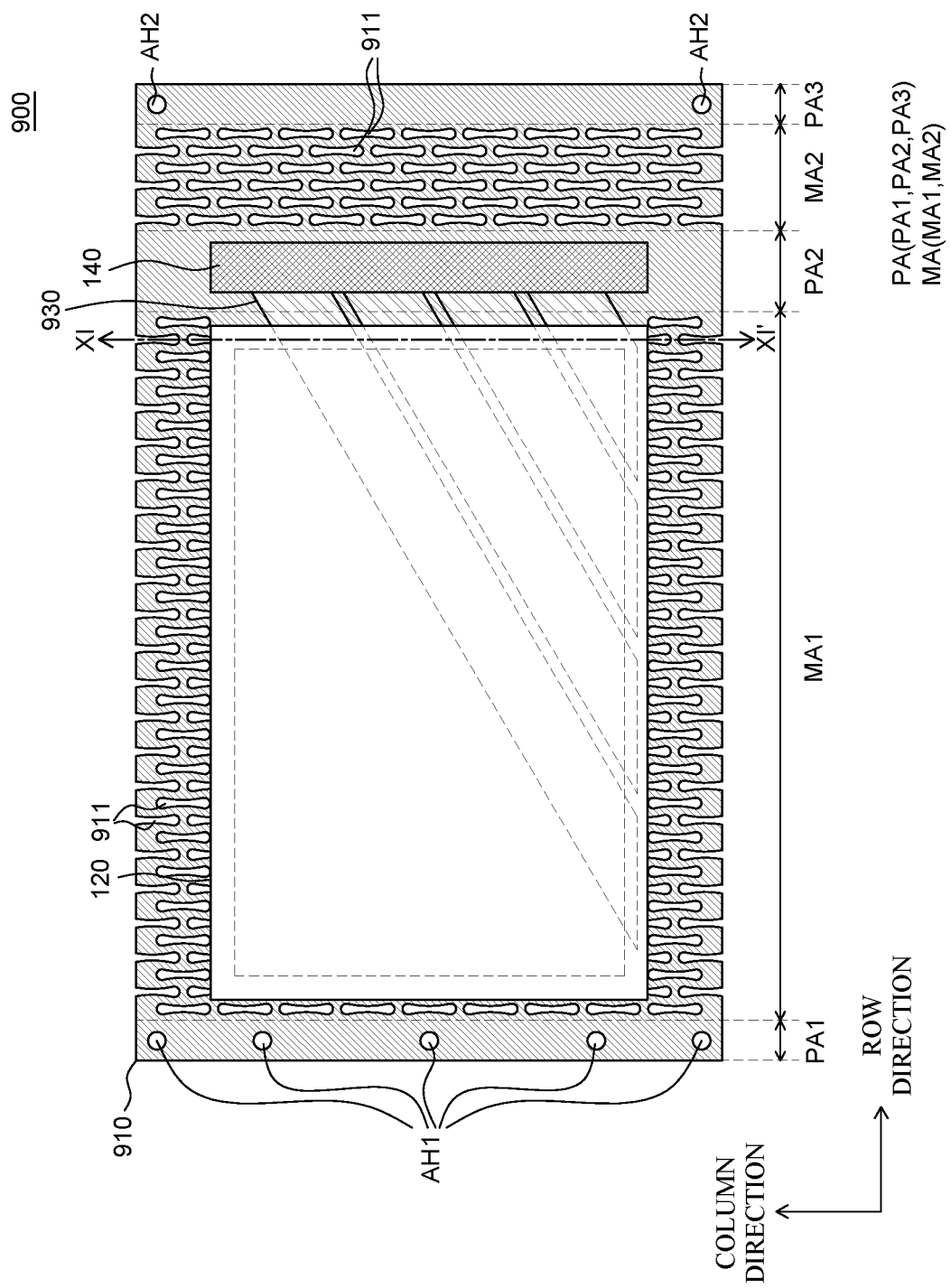
FIG. 9 is a plan view of a display device according to another embodiment of the present disclosure.
Figure 10:
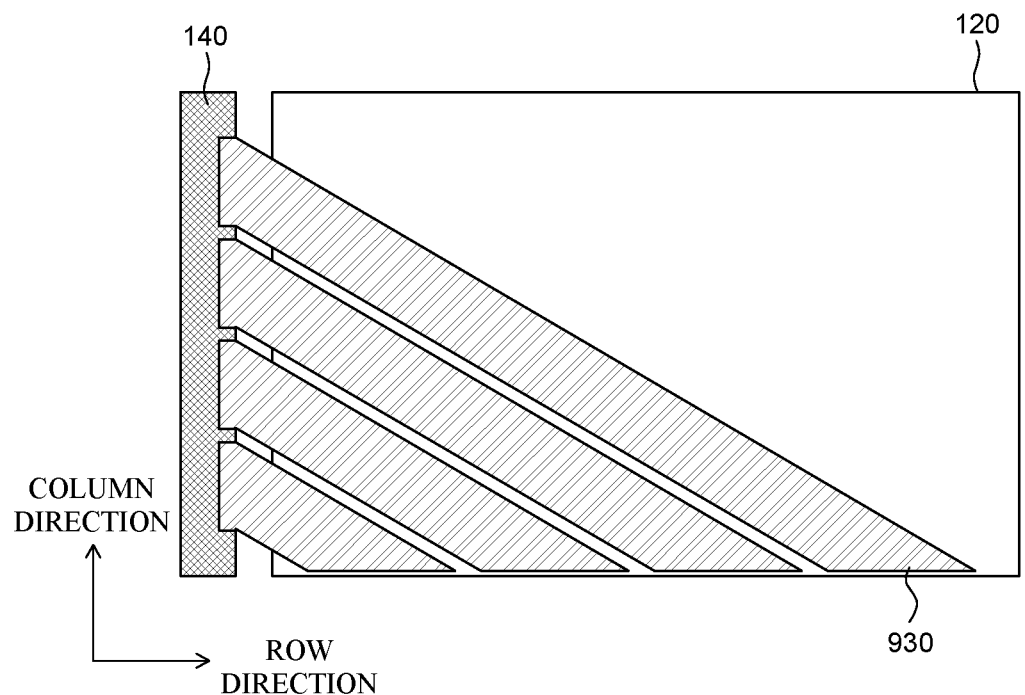
FIG. 10 is a rear view of the display device according to another embodiment of the present disclosure.
Figure 11:
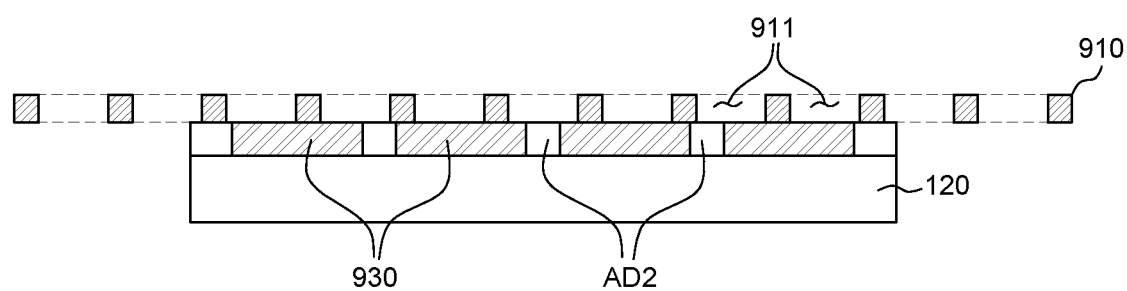
FIG. 11 is a cross-sectional view as taken along a line XI-XI' of FIG. 9 according to an embodiment of the present disclosure.

FIG. 9 is a plan view of a display device according to another embodiment of the present disclosure. FIG. 10 is a rear view of the display device according to another embodiment of the present disclosure. FIG. 11 is a cross-sectional view as taken along a line XI-XI' of FIG. 9. A display device 900 shown in FIG. 9 through FIG. 11 has substantially the same configuration as the display device 100 shown in FIG. 1 through FIG. 8C except a back cover 910 and a plurality of flexible films 930. Therefore, redundant description of the same components will not be provided. FIG. 9 through FIG. 11 illustrate only the back cover 910, the display panel 120, the plurality of flexible films 930, and the printed circuit board 140 among various components of the display device 900 for the convenience of description. Further, the illustration of the back cover 910 is omitted from FIG. 10 for the convenience of description.

Unlike the display device 100 shown in FIG. 1 through FIG. 8C which is wound or unwound in the column direction, the display device 900 according to another embodiment of the present disclosure may be wound or unwound in the row direction. Hereinafter, the display device 900 according to another embodiment of the present disclosure will be described as being wound or unwound in the row direction. Herein, it is assumed that the short sides of the display panel 120 are extended in the column direction and the long sides of the display panel 120 are extended in the row direction.

Referring to FIG. 9, the first supporting area PA1, the first flexible area MA1, the second supporting area PA2, the second flexible area MA2, and the third supporting area PA3 are disposed in sequence from the leftmost side of the back cover 910.

The first supporting area PA1 of the back cover 910 fastened to the head bar 164 is disposed adjacent to the leftmost side of the back cover 910 and the left edge, (e.g., the left short side, of the display panel 120. The third supporting area PA3 of the back cover 910 fastened to the roller 151 is disposed adjacent to the rightmost side of the back cover 910 and the right edge, (e.g., the right short side or a first side), of the display panel 120. Thus, the display panel 120 and the back cover 910 of the display device 900 according to another embodiment of the present disclosure can be bent in the row direction and wound around or unwound from the roller 151.

In order for the back cover 910 to be easily wound or unwound in the row direction, a plurality of openings 911 of the back cover 910 may have a column-direction maximum width which is larger than a row-direction maximum width. That is, the maximum width of the plurality of openings 911 in a vertical direction may be larger than the maximum width of the plurality of openings 911 in a transverse direction.

In this case, as the column-direction width of the plurality of openings 911 increases, it may become easier for the plurality of flexible areas MA of the back cover 910 to be flexibly deformed. Specifically, during winding of the back cover 910, the back cover 910 may be bent in the row direction and stress may be applied to expand the plurality of openings 911 in the row direction. In this case, if the column-direction width of the plurality of openings 911 increases, when the plurality of openings 911 is stretched in the row direction, the row-direction width of the plurality of openings 911 may increase. Further, as the plurality of openings 911 expands in the row direction, stress applied to the plurality of flexible areas MA may be reduced. Therefore, by increasing the column-direction width of the plurality of openings 911, the plurality of flexible areas MA of the back cover 910 can be easily wound or unwound and stress applied to the plurality of flexible areas MA can be reduced.

Referring to FIG. 9, the printed circuit board 140 is disposed in the second supporting area PA2 of the back cover 910 adjacent to the right edge of the display panel 120. The printed circuit board 140 is disposed along the second supporting area PA2 of the back cover 910 so that its long side is disposed facing the right edge of the display panel 120. Further, the long sides of the printed circuit board 140 may be disposed along the same direction as a long-axis direction of the plurality of openings 911. Further, the long-axis direction of the plurality of openings 911 may be parallel to the short sides of the display panel.

The printed circuit board 140 may not be bent unlike the display panel 120 or the plurality of flexible films 930. For example, the printed circuit board 140 may include various components on a rigid base substrate and serve to supply various signals to the plurality of flexible films 930 and the display panel 120. The printed circuit board 140 which is rigid without being bent is disposed on the second supporting area PA2 of the back cover 910 and can maintain a flat state. Further, when the display panel 120 and the back cover 910 are bent in the row direction and wound around the roller 151, the printed circuit board 140 may be mounted on the flat part of the roller 151 and thus can be maintained flat.

The plurality of flexible films 930 is electrically connected to the display panel 120 and the printed circuit board 140. Specifically, on the rear surface of the display panel 120, one ends of the plurality of flexible films 930 may be connected to the non-active area NA adjacent to the lower edge (e.g., a second side) of the display panel 120. Further, the other ends of the plurality of flexible films 930 may be connected to the printed circuit board 140 along the first side of the display panel 120 (e.g., the short side of the display panel 120). In one embodiment, a first end of each of the plurality of flexible films 930 is connected to the printed circuit board 140 disposed at the first side of the display panel (e.g., the short side) and a second end of each of the plurality of flexible films 930 is connected to the second side of the display panel 120 (e.g., a long side). As shown in FIG. 9, the plurality of flexible films 930 overlap the active area of the display panel 120.

FIG. 9 illustrates that the plurality of flexible films 930 is connected to the non-active area NA adjacent to the lower edge of the display panel 120. However, the plurality of flexible films 930 may be connected to the non-active area NA adjacent to the upper edge of the display panel 120. The disposition of the plurality of flexible films 930 is not limited thereto as long as the plurality of flexible films 930 is connected to one of the long sides of the display panel 120.

Hereafter, the plurality of flexible films 930 will be described in more detail with reference to FIG. 10 and FIG. 11.

Referring to FIG. 10, the plurality of flexible films 930 is disposed on the rear surface of the display panel 120. The plurality of flexible films 930 may be bonded to the rear surface of the display panel 120, e.g., the rear surface of the substrate 121. Further, the plurality of flexible films 930 may be connected to the printed circuit board 140 disposed adjacent to the right edge of the display panel 120 from the lower edge of the display panel 120.

Specifically, the plurality of flexible films 930 is disposed between the display panel 120 and the back cover 910. However, for the convenience of description, the illustration of the back cover 910 covering the plurality of flexible films 930 and the display panel 120 is omitted.

As shown in FIG. 10, each of the plurality of flexible films 930 includes a first portion. The first portion of each flexible film extends in a row direction (e.g., a second direction) from a first end of the flexible film that is connected to the printed circuit board 140. Each of the plurality of flexible films 930 also includes a second portion that extends diagonally from the first portion to the second end of the flexible film that is connected to the display panel 120. The second portion extends diagonally in a direction that is different from a column direction (e.g., a first direction) and the row direction.

The plurality of flexible films 930 may have different lengths from each other depending on the positions thereof. For example, a flexible film 930 closest to the printed circuit board 140 among the plurality of flexible films 930 may have the shortest length. Also, a flexible film 930 farthest from the printed circuit board 140 among the plurality of flexible films 930 may have the longest length. The plurality of flexible films 930 may be bent diagonally toward the lower edge of the display panel 120 and extended to the right edge perpendicular to the lower edge of the display panel 120. Thus, the plurality of flexible films 930 may have different lengths from each other.

One end of the plurality of flexible films 930 may be connected to the rear surface of the display panel 120 so as to be electrically connected to the display panel 120. Specifically, on the rear surface of the display panel 120, one ends of the plurality of flexible films 930 may be disposed in the non-active area NA adjacent to the lower edge, i.e., the long side, of the display panel 120. If the plurality of flexible films 930 is connected to the long side of the display panel 120, it is advantageous for the display device 900 to implement high resolution, compared to a case where the plurality of flexible films 930 is connected to the short side of the display panel 120.

The display panel 120 has a rectangular shape whose upper and lower edges are long sides and left and right edges are short sides. Unlike being shown in FIG. 10, the plurality of flexible films 930 may be connected to the non-active area NA adjacent to the short side of the display panel 120 and connected to the printed circuit board 140. In other words, the plurality of flexible films 930 may supply signals from the printed circuit board 140 to the short side of the display panel 120. However, if the plurality of flexible films 930 is connected to the non-active area NA adjacent to the short side of the display panel 120, various signals supplied from the printed circuit board 140 and the plurality of flexible films 930 to the short side of the display panel 120 may be supplied to each of the sub-pixels along the long side of the display panel 120. In this case, to implement a high-resolution image, a plurality of sub-pixels and an increased number of lines for supplying signals to the plurality of sub-pixels may be disposed on the display panel 120. To implement a much higher-resolution image, more sub-pixels need to be disposed in the limited area. Therefore, the lines may have a very small width and the like. If signals from the plurality of flexible films 930 are supplied to the short side of the display panel 120, the signals are supplied to the sub-pixels along the long side of the display panel 120. Thus, the length of the lines for supplying the signals increases, compared to a case where signals from the plurality of flexible films 930 are supplied to the long side of the display panel 120 and supplied to the plurality of sub-pixels along the short side. Therefore, if the plurality of flexible films 930 is connected to the non-active area NA adjacent to the short side of the display panel 120, the length of the lines for supplying the signals increases. Also, the reliability may decrease due to resistance or heat generation. Further, it may be difficult to implement a high-resolution image. Accordingly, if the plurality of flexible films 930 is connected to the non-active area NA adjacent to the long side of the display panel 120, the resolution and reliability of the display device 900 can be improved more easily. Thus, one ends of the plurality of flexible films 930 may be disposed in the non-active area NA adjacent to the long side of the display panel 120.

In this case, the plurality of flexible films 930 whose one ends are connected to the non-active area NA adjacent to the long side of the display panel 120 needs to be connected to the printed circuit board 140 disposed adjacent to the right edge, i.e., the short side, of the display panel 120. Thus, the plurality of flexible films 930 may be extended from the rear surface of the display panel 120 toward the printed circuit board 140.

The plurality of flexible films 930 may be extended straight from the rear surface of the display panel 120 and connected to the printed circuit board 140. That is, the plurality of flexible films 930 is disposed along the shortest direct distance between a point connected to the display panel 120 and a point connected to the printed circuit board 140. Thus, the length of the plurality of flexible films 930 disposed on the rear surface of the display panel 120 can be increased to a minimum. Further, the plurality of flexible films 930 is closely contacted with the rear surface of the display panel 120. Thus, a separate space for the plurality of flexible films 930 is not needed and the display device 900 can have a small thickness.

Referring to FIG. 11, the plurality of flexible films 930 and the second adhesive layer AD2 are disposed between the display panel 120 and the back cover 910. The second adhesive layer AD2 may bond the display panel 120 and the back cover 910 and also bond the plurality of flexible films 930 between the display panel 120 and the back cover 910 to the display panel 120 and the back cover 910. The second adhesive layer AD2 may fix the plurality of flexible films 930 between the display panel 120 and the back cover 910 so as not to be moved during winding or unwinding of the display device 900.

Since the plurality of flexible films 930 is disposed between the display panel 120 and the back cover 910, the plurality of flexible films 930 can be protected against external impacts during winding or unwinding of the display device 900. In other words, the back cover 910 is disposed to cover the plurality of flexible films 930, and, thus, damage to the plurality of flexible films 930 by external impacts can be minimized.

The second adhesive layer AD2 may also reduce stress applied to the plurality of flexible films 930 during winding of the display panel 120 and the back cover 910. Specifically, stress generated during winding of the display panel 120 and the back cover 910 may not be concentrated on the plurality of flexible films 930 but may be distributed by the second adhesive layer AD2.

In the display device 900 according to another embodiment of the present disclosure, the plurality of flexible films 930 having different lengths from each other is disposed on the rear surface of the display panel 120. Thus, a winding direction of the display panel 120 can be easily changed. The display panel 120 may have a rectangular shape including the long sides along the row direction and the short sides along the column direction. If the rectangular display panel 120 is wound in the row direction, the plurality of flexible areas MA and the plurality of supporting areas PA of the back cover 910 are disposed in sequence in the row direction. Also, the roller 151 and the printed circuit board 140 may be disposed adjacent to the short side of the display panel 120. In this case, to implement the display device 900 with high resolution, the plurality of flexible films 930 may be connected to the non-active area NA adjacent to the long side of the display panel 120. The plurality of flexible films 930 may be bent diagonally toward the long side of the display panel 120. This is to connect the plurality of flexible films 930 to both the printed circuit board 140 adjacent to the short side of the display panel 120 and the non-active area NA adjacent to the long side of the display panel 120. The plurality of flexible films 930 whose one ends are disposed in the non-active area NA adjacent to the long side of the display panel 120 may be bent toward the rear surface of the display panel 120. Then, the plurality of flexible films 930 may be extended to the short side of the display panel 120 adjacent to the printed circuit board 140. In this case, each of the plurality of flexible films 930 may have a different length. Only when the plurality of flexible films 930 bent diagonally toward the long side of the display panel 120 has different lengths from each other, the printed circuit board 140 connected to the other ends of the plurality of flexible films 930 can be disposed parallel to the short side of the display panel 120. Therefore, in the display device 900 according to another embodiment of the present disclosure, the plurality of flexible films 930 connected to the non-active area NA adjacent to the long side of the display panel 120 is extended to the short side. Thus, the disposition of the printed circuit board 140 can be freely changed and a winding direction of the display panel 120 can be easily changed.

In the display device 900 according to another embodiment of the present disclosure, a winding direction of the display device 900 is not limited. Thus, it is possible to implement the display device 900 with high resolution by connecting the plurality of flexible films 930 to the non-active area NA adjacent to the long side of the display panel 120. The display panel 120 may have a rectangular shape including the long sides along the row direction and the short sides along the column direction. If the display panel 120 is wound in the row direction, the roller 151 and the printed circuit board 140 may be disposed adjacent to the short side of the display panel 120. In this case, the plurality of flexible films 930 connected to the printed circuit board 140 adjacent to the short side of the display panel 120 may be connected to the non-active area NA adjacent to the long side, not the short side, of the display panel 120. Specifically, the plurality of flexible films 930 may have different lengths from each other. Thus, the plurality of flexible films 930 may be extended diagonally from the long side toward the short side of the display panel 120. Thus, the plurality of flexible films 930 may be connected to each of the non-active area NA adjacent to the long side of the display panel 120 and the printed circuit board 140 adjacent to the short side of the display panel 120. Since the plurality of flexible films 930 can supply signals to the long side of the display panel 120, it is possible to implement the display device 900 with high resolution. Specifically, as the resolution increases, the number of lines disposed in the display panel 120 increases and the circuit structure becomes complicated. If the plurality of flexible films 930 is connected to the non-active area NA adjacent to the short side of the display panel 120, signals may be supplied to lines disposed along a long-side direction of the display panel 120. If the plurality of flexible films 930 is connected to the non-active area NA adjacent to the long side of the display panel 120, signals may be supplied to lines disposed along a short-side direction of the display panel 120. Therefore, when the plurality of flexible films 930 is connected to the non-active area NA adjacent to the short side of the display panel 120, signals are supplied along relatively long lines, compared to a case where the plurality of flexible films 930 is connected to the non-active area NA adjacent to the long side of the display panel 120. Also, the lines have a very small width. Therefore, voltage drop and heat generation may occur due to resistance. Thus, to implement the display device 900 with high resolution, the plurality of flexible films 930 needs to be connected to the non-active area NA adjacent to the long side of the display panel 120. In this case, resistance or heat generation can be relatively small and the reliability of the display device 900 can be improved. Therefore, in the display device 900 according to another embodiment of the present disclosure, even if the printed circuit board 140 is disposed adjacent to the short side of the display panel 120, the plurality of flexible films 930 can be connected to the non-active area NA adjacent to the long side of the display panel 120. Thus, it is possible to minimize the deterioration of reliability caused by resistance or heat generation and also possible to implement the display device 900 with high resolution.

In the display device 900 according to another embodiment of the present disclosure, the length of the plurality of flexible films 930 is increased to a minimum length. Thus, the reliability of the display device 900 can be improved and the display device 900 can have a small thickness. The plurality of flexible films 930 is extended from the non-active area NA adjacent to the long side of the display panel 120 toward the printed circuit board 140 adjacent to the short side of the display panel 120. In this case, the plurality of flexible films 930 may be extended along the shortest direct distance between the long side of the display panel 120 and the printed circuit board 140 adjacent to the short side of the display panel 120. Thus, the length of the plurality of flexible films 930 can be increased to a minimum length. Since the length of the plurality of flexible films 930 is increased to a minimum length, resistance or heat generation can be minimized. Further, since the plurality of flexible films 930 has the shortest length and the plurality of flexible films 930 is closely contacted with the rear surface of the display panel 120, a thickness increase of the display device 900 can be minimized. Therefore, in the display device 900 according to another embodiment of the present disclosure, the plurality of flexible films 930 is disposed along the shortest direct distance. Thus, resistance or heat generation of the plurality of flexible films 930 can be minimized and a thickness increase of the display device 900 can be minimized <Flexible Films Extended in Curved Shape>

Figure 12:
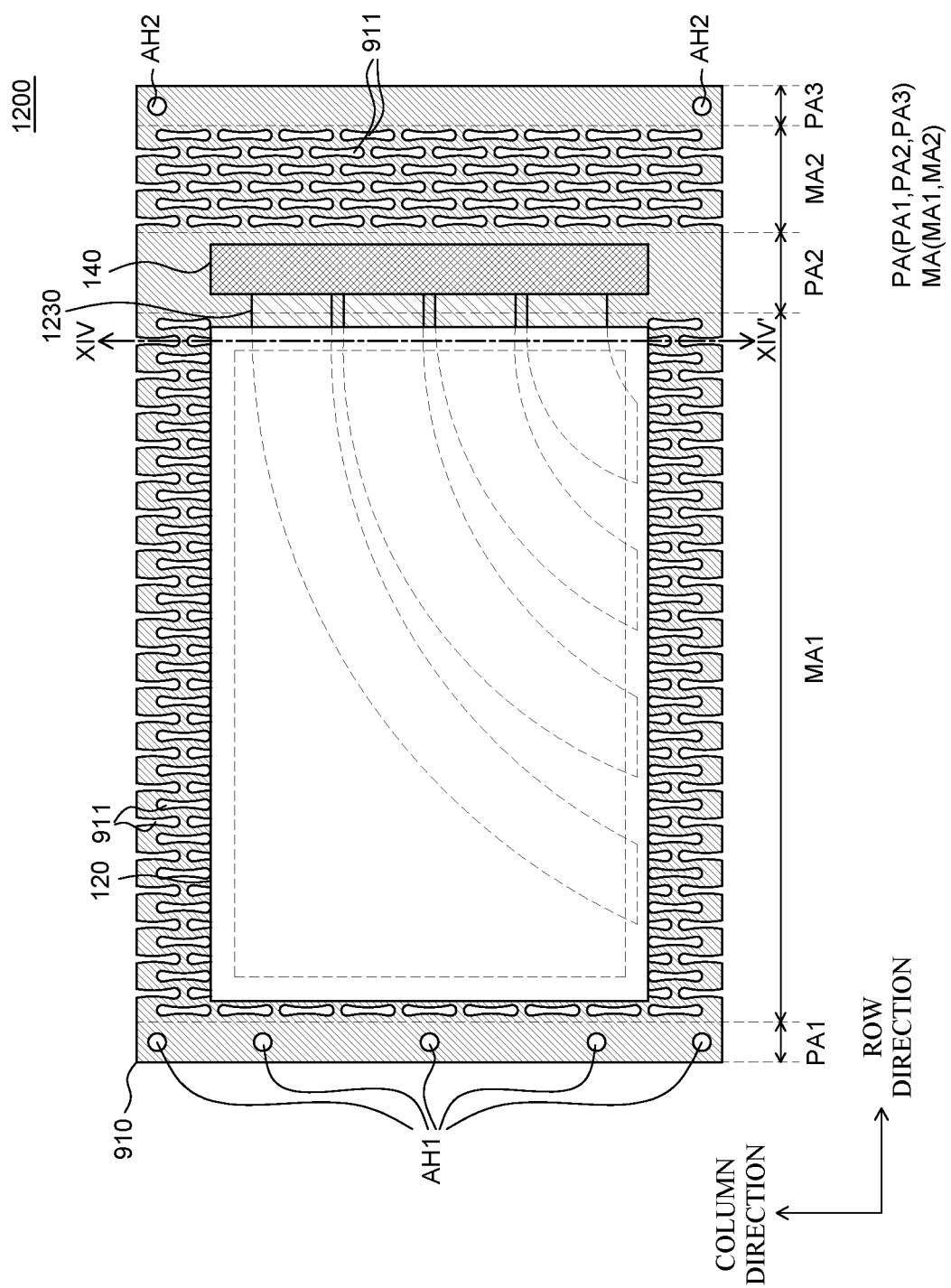
FIG. 12 is a plan view of a display device according to yet another embodiment of the present disclosure.
Figure 13:
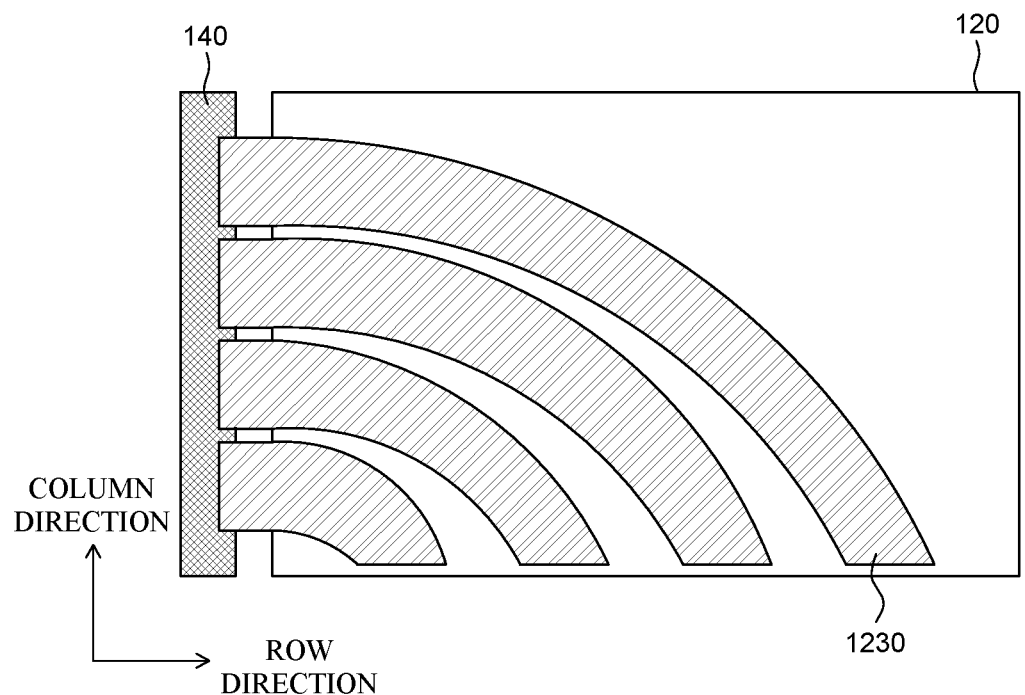
FIG. 13 is a rear view of the display device according to yet another embodiment of the present disclosure.
Figure 14:
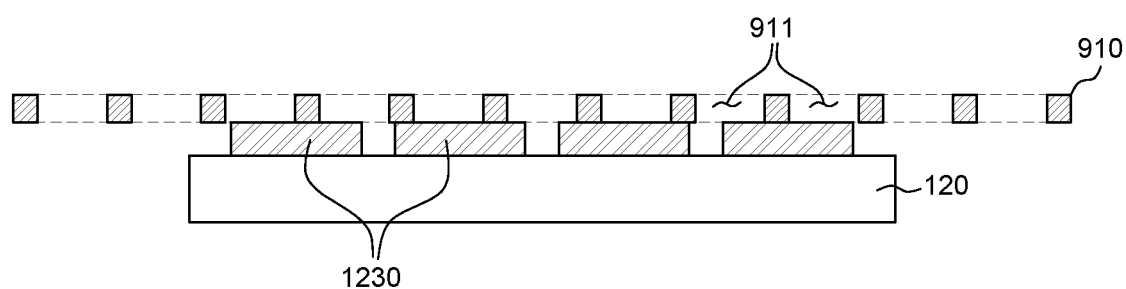
FIG. 14 is a cross-sectional view as taken along a line XIV-XIV' of FIG. 12 according to an embodiment of the present disclosure.

FIG. 12 is a plan view of a display device according to yet another embodiment of the present disclosure. FIG. 13 is a rear view of the display device according to yet another embodiment of the present disclosure. FIG. 14 is a cross-sectional view as taken along a line XIV-XIV' of FIG. 12. A display device 1200 shown in FIG. 12 through FIG. 14 has substantially the same configuration as the display device 900 shown in FIG. 9 through FIG. 11 except a plurality of flexible films 1230 and the second adhesive layer AD2. Therefore, redundant description of the same components will not be provided.

Referring to FIG. 12 and FIG. 13, the plurality of flexible films 1230 may be extended in a curved shape and connected to the printed circuit board 140. One ends (e.g., a first end) of the plurality of flexible films 1230 may be connected to the non-active area NA adjacent to the lower edge of the display panel 120 and the other ends (e.g., a second end) of the plurality of flexible films 1230 may be connected to the printed circuit board 140. As shown in FIGS. 12 and 13, the plurality of flexible films 1230 is curved between the first and second ends. In this case, the plurality of flexible films 1230 may be extended, not straight, but in a curved shape. The plurality of flexible films 1230 is extended in a curved shape and thus can be closely contacted with or spaced apart from a rear surface of the back cover 910. That is, the plurality of flexible films 1230 is formed into a curved shape and thus can have slack between the back cover 910 and the display panel 120 so as to be spaced apart from the back cover 910 and the display panel 120. Further, during winding of the back cover 910, stress applied to the plurality of flexible films 1230 can be reduced.

Referring to FIG. 14, the plurality of flexible films 1230 is disposed between the display panel 120 and the back cover 910, but any adhesive layer is not disposed. That is, the plurality of flexible films 1230 disposed between the display panel 120 and the back cover 910 may not be fixed to the back cover 910 and the display panel 120 by a separate adhesive layer. Thus, as described above, if the plurality of flexible films 1230 is formed into a curved shape and has slack to be spaced apart from the back cover 910 and the display panel 120, the flexible films 1230 can move more flexibly.

In the display device 1200 according to yet another embodiment of the present disclosure, the plurality of flexible films 1230 is formed into a curved shape. Thus, during winding or unwinding of the display device 1200, stress applied to the plurality of flexible films 1230 can be reduced. The plurality of flexible films 1230 extended from the non-active area NA adjacent to the long side of the display panel 120 to the short side of the display panel 120 may be extended, not straight, but in a curved shape. Thus, the plurality of flexible films 1230 can be closely contacted with the rear surface of the back cover 910 or can be spaced apart from the back cover 910. That is, the plurality of flexible films 1230 may be extended in a curved shape and may also have slack to be selectively spaced apart from the rear surface of the back cover 910. Therefore, during winding or unwinding of the back cover 910, stress applied to the plurality of flexible films 1230 on the rear surface of the back cover 910 can be reduced. Therefore, in the display device 1200 according to yet another embodiment of the present disclosure, during winding or unwinding of the display device 1200, stress applied to the plurality of flexible films 1230 can be reduced. Thus, damage to the plurality of flexible films 1230 or the deterioration of reliability can be minimized.

FIG. 12 through FIG. 14 illustrate that the plurality of flexible films 1230 is disposed between the display panel 120 and the back cover 910 without any adhesive layer. However, the present disclosure is not limited thereto. As in the display device 900 shown in FIG. 9 through FIG. 11, the second adhesive layer AD2 may be disposed therebetween.

<Flexible Films Disposed Outside Back Cover>

Figure 15:
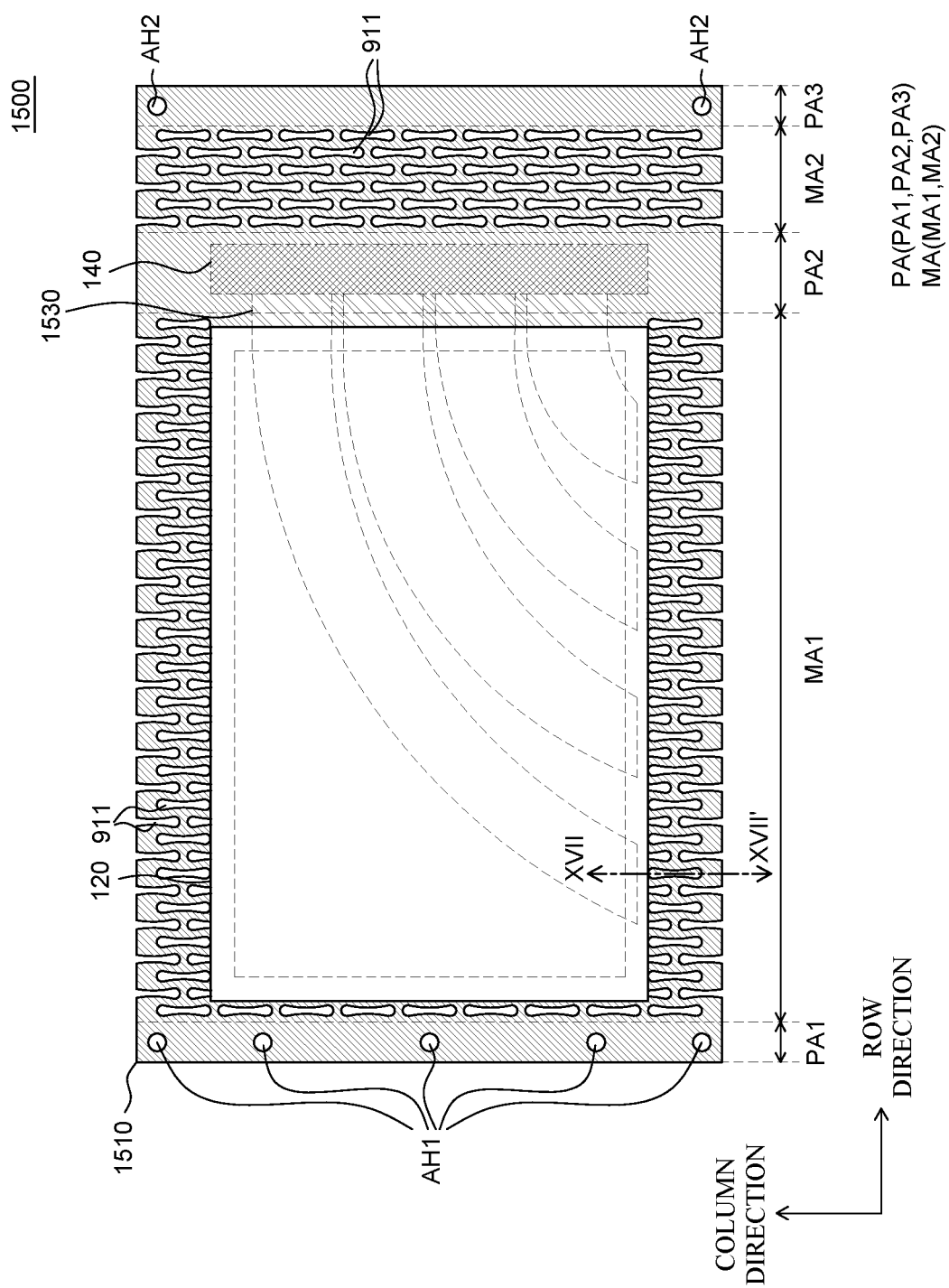
FIG. 15 is a plan view of a display device according to still another embodiment of the present disclosure.
Figure 16:
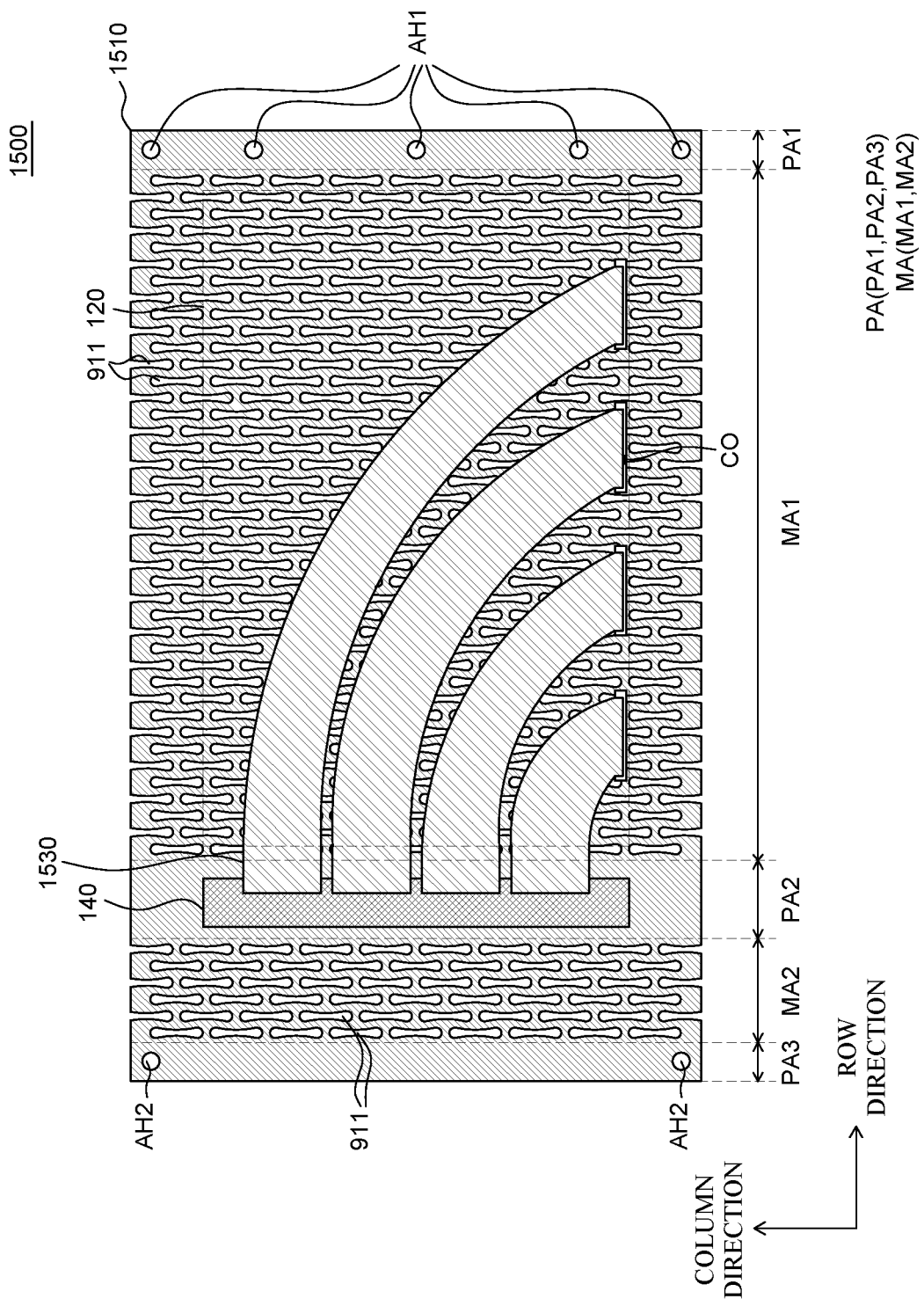
FIG. 16 is a rear view of the display device according to still another embodiment of the present disclosure.
Figure 17:
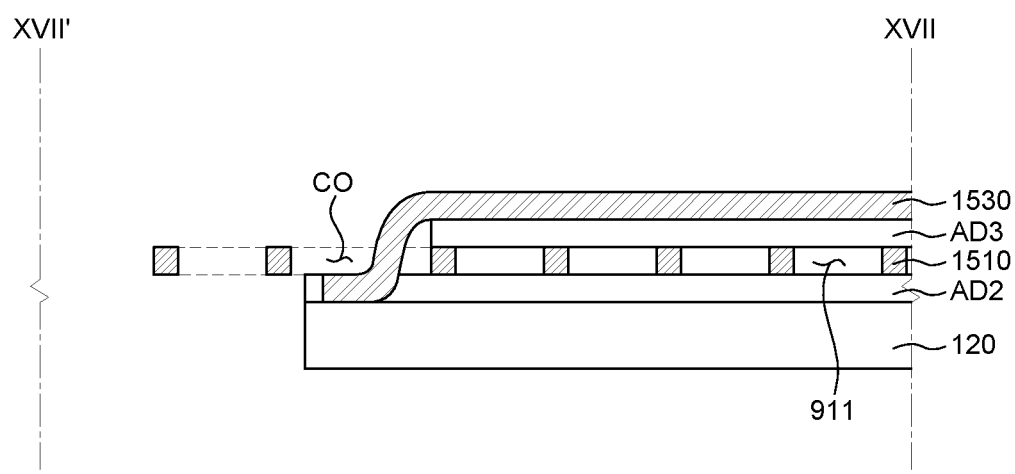
FIG. 17 is a cross-sectional view as taken along a line XVII-XVII' of FIG. 15 according to an embodiment of the present disclosure.

FIG. 15 is a plan view of a display device according to still another embodiment of the present disclosure. FIG. 16 is a rear view of the display device according to still another embodiment of the present disclosure. FIG. 17 is a cross-sectional view as taken along a line XVII-XVII' of FIG. 15. A display device 1500 shown in FIG. 15 through FIG. 17 has substantially the same configuration as the display device 1200 shown in FIG. 12 through FIG. 14 except a back cover 1510, a plurality of flexible films 1530, and the addition of a third adhesive layer AD3. Therefore, redundant description of the same components will not be provided.

Referring to FIG. 15 through FIG. 17, the back cover 1510 further includes contact openings CO. The contact openings CO may expose the rear surface of the display panel 120 from the back cover 1510, and the display panel 120 and the plurality of flexible films 1530 may be connected through the contact openings CO. The contact openings CO are formed where one ends of the plurality of flexible films 1530 are disposed and thus may expose a part of the rear surface of the display panel 120 from the back cover 1510. Therefore, the plurality of flexible films 1530 disposed on a rear surface of the back cover 1510 can be connected to the rear surface of the display panel 120 through the contact openings CO.

Referring to FIG. 16 and FIG. 17, the plurality of flexible films 1530 is disposed on the rear surface of the back cover 1510. The plurality of flexible films 1530 may be disposed as extended from the rear surface of the display panel 120 to the rear surface of the back cover 1510 through the contact openings CO of the back cover 1510. The plurality of flexible films 1530 may be bent to the rear surface of the back cover 1510 and connected to the printed circuit board 140 disposed on the rear surface of the back cover 1510. Therefore, the plurality of flexible films 1530 may be disposed on the outermost side of the display part.

In this case, the plurality of flexible films 1530 may be extended in a curved shape and connected to the printed circuit board 140. The plurality of flexible films 1530 is extended in a curved shape and thus can be closely contacted with or spaced apart from the rear surface of the back cover 1510. That is, the plurality of flexible films 1530 is formed into a curved shape and thus can have slack to be somewhat spaced apart from the back cover 1510. Further, during winding of the back cover 1510, stress applied to the plurality of flexible films 1530 can be reduced.

Referring to FIG. 17, the third adhesive layer AD3 is disposed between the back cover 1510 and the plurality of flexible films 1530. The third adhesive layer AD3 may bond the plurality of flexible films 1530 and the back cover 1510. The third adhesive layer AD3 may bond the plurality of flexible films 1530 disposed on the rear surface of the back cover 1510 so as not to be moved excessively during winding or unwinding of the display panel 120 and the back cover 1510. However, the present disclosure is not limited thereto. The third adhesive layer AD3 may be omitted and the plurality of flexible films 1530 may not be fixed to the back cover 1510.

The third adhesive layer AD3 may be formed of an adhesive material and may be a thermosetting or naturally-curable adhesive. For example, the third adhesive layer AD3 may be formed of an optical clear adhesive (OCA), a pressure sensitive adhesive (PSA), or the like, but is not limited thereto.

In the display device 1500 according to still another embodiment of the present disclosure, the plurality of flexible films 1530 is disposed on the rear surface of the back cover 1510, i.e., on the outermost side of the display part. Thus, the heat radiation efficiency of the plurality of flexible films 1530 can be improved. The plurality of flexible films 1530 connected to the non-active area NA on the rear surface of the display panel 120 may be bent to the rear surface of the back cover 1510 supporting the rear surface of the display panel 120. Thus, the plurality of flexible films 1530 may be disposed on the outermost side of the display part. In this case, the plurality of flexible films 1530 may penetrate the contact openings CO of the back cover 1510 and may be bent to the rear surface of the back cover 1510. Since the plurality of flexible films 1530 is disposed on the rear surface of the back cover 1510, i.e., on the outermost side of the display part, heat generated from the plurality of flexible films 1530 can be effectively radiated. Therefore, in the display device 1500 according to still another embodiment of the present disclosure, performance degradation of the plurality of flexible films 1530 caused by heat generation of the plurality of flexible films 1530 can be minimized. Also, the durability of the plurality of flexible films 1530 can be improved.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A rollable display device comprising:
a rollable display panel including a plurality of pixels, the rollable display panel having a first side that extends along a first direction and a second side that extends along a second direction that is different from the first direction, the second side longer than the first side;
a printed circuit board disposed along the first side of the rollable display panel; and
a plurality of flexible films each having a first end and a second end, the first end of each of the plurality of flexible films connected to the printed circuit board disposed at the first side of the rollable display panel and the second end of each of the plurality of flexible films connected to the second side of the rollable display panel.

2. The rollable display device of claim 1, wherein the rollable display panel is configured to be rolled along the second direction.

3. The rollable display device of claim 1, wherein each of the plurality of flexible films have a different length.

4. The rollable display device of claim 1, wherein the plurality of flexible films are disposed behind the rollable display panel such that the plurality of flexible films are overlapped by an active area of the rollable display panel, the active area displaying an image.

5. The rollable display device of claim 1, wherein a first portion of the plurality of flexible films extends from the first end in the second direction and a second portion of the plurality of flexible films extends diagonally from the first portion to the second end in a direction that is different from the first direction and the second direction.

6. The rollable display device of claim 1, wherein the plurality of flexible films are curved between the first end and the second end of the plurality of flexible films.

7. The rollable display device of claim 1, further comprising:
a back cover configured to overlap a rear surface of the rollable display panel, the back cover comprising:
a first portion that includes a plurality of openings, the first portion overlapping the rear surface of the rollable display panel; and
a second portion that lacks the plurality of openings, the second portion overlapping the printed circuit board without overlapping the rollable display panel.

8. The rollable display device of claim 7, wherein the plurality of flexible films are disposed between the rollable display panel and the back cover.

9. The rollable display device of claim 8, wherein the plurality of flexible films bend toward a rear surface of the rollable display panel when the rollable display device is in a rolled state.

10. The rollable display device of claim 7, wherein the plurality of openings includes a plurality of sides having different lengths and a side of the plurality of openings having a longest length is parallel to the printed circuit board and the first side of the rollable display panel.

11. The rollable display device of claim 8, further comprising:

an adhesive that adheres the rollable display panel and the plurality of flexible films to the back cover, the adhesive disposed between pairs of flexible films from the plurality of flexible films.

12. The rollable display device of claim 7, wherein the back cover is disposed between the rollable display panel and the plurality of flexible films.

13. The rollable display device of claim 12, wherein the back cover further comprises a plurality of contact openings in the first portion of the back cover, the plurality of contact openings larger than the plurality of openings,
wherein each of the plurality of flexible films contacts the rollable display panel through a corresponding one of the plurality of contact openings.

14. The rollable display device of claim 13, further comprising:
a first adhesive layer between the rollable display panel and the back cover, the first adhesive adhering together the rollable display panel and the back cover; and
a second adhesive layer between the plurality of flexible films and the back cover, the second adhesive layer adhering together the plurality of flexible films and the back cover.

15. A rollable display device comprising:
a rollable display panel including a plurality of pixels in an active area of the rollable display panel that displays an image, the rollable display panel having a first side and a second side;
a printed circuit board disposed along the first side of the rollable display panel, and
a plurality of flexible films each having a first end and a second end, the first end of each of the plurality of flexible films connected to the printed circuit board disposed at the first side of the rollable display panel and the second end of each of the plurality of flexible films connected to the second side of the rollable display panel such that the plurality of flexible films overlap the active area of the rollable display panel.

16. The rollable display device of claim 15, wherein the rollable display panel is configured to be rolled along a direction of the second side of the rollable display panel, the second side longer than the first side.

17. The rollable display device of claim 15, wherein each of the plurality of flexible films have a different length.

18. The rollable display device of claim 15, wherein a first portion of the plurality of flexible films extends from the first end in a direction parallel to the second side of the rollable display panel and a second portion of the plurality of flexible films extends diagonally from the first portion to the second end of the plurality of flexible films.

19. The rollable display device of claim 15, wherein the plurality of flexible films are curved between the first end and the second end of the plurality of flexible films.

20. The rollable display device of claim 15, further comprising:
a back cover configured to overlap a rear surface of the rollable display panel, the back cover comprising:
a first portion that includes a plurality of openings, the first portion overlapping the rollable display panel; and
a second portion that lacks the plurality of openings, the second portion overlapping the printed circuit board without overlapping the rollable display panel.

21. The rollable display device of claim 20, wherein the plurality of flexible films are disposed between the rollable display panel and the back cover.

22. The rollable display device of claim 21, wherein the plurality of flexible films bend toward a rear surface of the rollable display panel when the rollable display device is in a rolled state.

23. The rollable display device of claim 20, wherein the plurality of openings includes a plurality of sides having different lengths and a side of the plurality of openings having a longest length is parallel to the printed circuit board and the first side of the rollable display panel.

24. The rollable display device of claim 21, further comprising:
an adhesive that adheres the rollable display panel and the plurality of flexible films to the back cover, the adhesive disposed between pairs of flexible films from the plurality of flexible films.

25. The rollable display device of claim 20, wherein the back cover is disposed between the rollable display panel and the plurality of flexible films.

26. The rollable display device of claim 25, wherein the back cover further comprises a plurality of contact openings in the first portion of the back cover, the plurality of contact openings larger than the plurality of openings,
wherein each of the plurality of flexible films contacts the rollable display panel through a corresponding one of the plurality of contact openings.

27. The rollable display device of claim 26, further comprising:
a first adhesive layer between the rollable display panel and the back cover, the first adhesive adhering together the rollable display panel and the back cover; and
a second adhesive layer between the plurality of flexible films and the back cover, the second adhesive layer adhering together the plurality of flexible films and the back cover.

28. A display device, comprising:
a rollable display panel;
a plurality of flexible films electrically connected to the display panel, each of the plurality of flexible films having a different length; and
a printed circuit board electrically connected to the plurality of flexible films.

29. The display device of claim 28, further comprising:
a back cover supporting the display panel and including a plurality of openings; and
a roller unit configured to wind or unwind the display panel and the back cover_.

30. The display device according to claim 28, wherein a first end and a second end of each of the plurality of flexible films are disposed on two adjacent sides of the display panel.

31. The display device according to claim 28, wherein the plurality of flexible films extend from a first side of the display panel adjacent to the printed circuit board toward a second side of the display panel.

32. The display device according to claim 29, wherein the plurality of flexible films is disposed between the display panel and the back cover.

33. The display device according to claim 29, wherein the back cover is disposed between at least a part of the plurality of flexible films and the display panel.

34. The display device according to claim 33, wherein the plurality of flexible films are bent toward a rear surface of the back cover, and
the back cover further includes contact openings exposing contact positions between the display panel and the plurality of flexible films.

* * * * *